US012782166B2

(12) United States Patent
Kubik et al.

(10) Patent No.: US 12,782,166 B2
(45) Date of Patent: Nov. 3, 2026

(54) MAGNETIC MULTI-TURN SENSOR

(71) Applicant: Analog Devices International Unlimited Company, County Limerick (IE)

(72) Inventors: Jan Kubik, Limerick (IE); Jochen Schmitt, Biedenkopf (DE); Fernando Franco, Limerick (IE)

(73) Assignee: ANALOG DEVICES INTERNATIONAL UNLIMITED COMPANY, County Limerick (IE)

(*) Notice: Subject to any disclaimer, the term of this patent is extended or adjusted under 35 U.S.C. 154(b) by 144 days.

(21) Appl. No.: 18/887,354

(22) Filed: Sep. 17, 2024

(65) Prior Publication Data

US 2025/0093182 A1 Mar. 20, 2025

Related U.S. Application Data

(60) Provisional application No. 63/583,365, filed on Sep. 18, 2023.

(51) Int. Cl.
*G01D 5/16* (2006.01)
*G01R 33/09* (2006.01)

(52) U.S. Cl.
CPC ............... *G01D 5/16* (2013.01); *G01R 33/09* (2013.01)

(58) Field of Classification Search
CPC ....... G01D 5/16; G01R 33/09; G01R 33/1292
See application file for complete search history.

(56) References Cited

U.S. PATENT DOCUMENTS

| | | | |
|---|---|---|---|
| 9,310,446 | B2 | 4/2016 | Kubik |
| 9,377,327 | B2 | 6/2016 | Kubik |
| 9,484,136 | B2 | 11/2016 | Morrissey et al. |
| 10,101,414 | B2 | 10/2018 | Kubik et al. |
| 10,145,906 | B2 | 12/2018 | O'donnell et al. |

(Continued)

FOREIGN PATENT DOCUMENTS

| | | | |
|---|---|---|---|
| CN | 112146555 A | 12/2020 | |
| CN | 114152187 A * | 3/2022 | .......... H10W 44/501 |

(Continued)

OTHER PUBLICATIONS

Borie et al. "Reliable Propagation of Magnetic Domain Walls in Cross Structures for Advanced Multiturn Sensors" Phys. Rev. Applied 8, 044004 Oct. 13, 2017 retrieved from https://journals.aps.org/prapplied/abstract/10.1103/Phys RevApplied.8.044004.*

(Continued)

*Primary Examiner* — Christopher E Mahoney
(74) *Attorney, Agent, or Firm* — Knobbe, Martens, Olson & Bear, LLP

(57) ABSTRACT

Aspects of the present disclosure provide a magnetoresistive track for use in a magnetic multi-turn sensor, the magnetoresistive track comprising one or more looped sections. The looped sections can include a crossing where the magnetoresistive track crosses itself at substantially 90 degrees. In some cases, the looped portions may be further provided with syphon structures to prevent domain walls propagating around the magnetoresistive track as an external magnetic field rotates from becoming stuck at the crossing or propagating in the wrong direction at the crossing.

20 Claims, 21 Drawing Sheets

(56) References Cited

U.S. PATENT DOCUMENTS

| | | | |
|---|---|---|---|
| 10,309,803 | B2 | 6/2019 | Cosgrave et al. |
| 10,393,197 | B2 | 8/2019 | Baehr et al. |
| 10,415,998 | B2 | 9/2019 | Dietrich et al. |
| 10,429,456 | B2 | 10/2019 | O'donnell et al. |
| 10,551,215 | B2 | 2/2020 | English et al. |
| 10,697,800 | B2 | 6/2020 | Schmitt |
| 10,712,369 | B2 | 7/2020 | Lerner et al. |
| 10,731,737 | B2 | 8/2020 | Dietrich et al. |
| 10,739,163 | B2 | 8/2020 | Heyd et al. |
| 10,739,165 | B2 | 8/2020 | Schmitt |
| 10,782,153 | B2 | 9/2020 | Schmitt |
| 10,788,517 | B2 | 9/2020 | Blanchard, III et al. |
| 10,830,571 | B2 | 11/2020 | Schmitt et al. |
| 10,859,406 | B2 | 12/2020 | Richard et al. |
| 10,955,493 | B2 | 3/2021 | Sharma et al. |
| 11,060,571 | B2 | 7/2021 | Dietrich |
| 11,061,086 | B2 | 7/2021 | O'donnell et al. |
| 11,175,353 | B2 | 11/2021 | Schmitt et al. |
| 11,187,763 | B2 | 11/2021 | Schmitt et al. |
| 11,248,971 | B2 | 2/2022 | Nicholl et al. |
| 11,280,639 | B2 | 3/2022 | Schmitt |
| 11,294,003 | B2 | 4/2022 | Schmitt et al. |
| 11,307,055 | B2 | 4/2022 | Schmitt |
| 11,398,765 | B2 | 7/2022 | Buchet et al. |
| 11,404,197 | B2 | 8/2022 | Kubik et al. |
| 11,460,323 | B2 | 10/2022 | Schmitt et al. |
| 11,460,521 | B2 | 10/2022 | Schmitt et al. |
| 11,519,751 | B2 | 12/2022 | Schmitt et al. |
| 11,519,941 | B2 | 12/2022 | Schmitt |
| 11,536,297 | B2 | 12/2022 | Hodrus |
| 11,573,072 | B2 | 2/2023 | Schmitt |
| 11,614,341 | B2 | 3/2023 | Schmitt et al. |
| 11,637,482 | B2 | 4/2023 | Schmitt et al. |
| 11,647,678 | B2 | 5/2023 | Bolognia et al. |
| 11,649,157 | B2 | 5/2023 | O'donnell et al. |
| 11,719,772 | B2 | 8/2023 | Schmitt |
| 11,733,065 | B2 | 8/2023 | Schmitt et al. |
| 11,754,646 | B2 | 9/2023 | Schmitt et al. |
| 11,761,793 | B2 | 9/2023 | Richard et al. |
| 11,940,502 | B2 | 3/2024 | O'donnell et al. |
| 11,953,567 | B2 | 4/2024 | Meehan et al. |
| 12,025,683 | B2 | 7/2024 | Schmitt et al. |
| 12,038,308 | B2 | 7/2024 | Schmitt et al. |
| 12,078,695 | B2 | 9/2024 | Schmitt et al. |
| 12,111,220 | B2 | 10/2024 | Hintze et al. |
| 2016/0265941 | A1 | 9/2016 | Mattheis et al. |
| 2017/0169929 | A1 | 6/2017 | Kubik |
| 2018/0344203 | A1 | 12/2018 | Sharma et al. |
| 2019/0195613 | A1 | 6/2019 | Zimmer et al. |
| 2020/0182314 | A1 | 6/2020 | Wei et al. |
| 2021/0372820 | A1 | 12/2021 | Schmitt et al. |
| 2022/0075010 | A1 | 3/2022 | Meehan et al. |
| 2022/0326049 | A1 | 10/2022 | Schmitt et al. |
| 2022/0326322 | A1 | 10/2022 | Schmitt et al. |
| 2022/0355863 | A1 | 11/2022 | Lindenmayr et al. |
| 2023/0016196 | A1 | 1/2023 | Gorbold et al. |
| 2023/0099490 | A1* | 3/2023 | Ota ...................... G01R 15/205 324/252 |
| 2023/0152166 | A1 | 5/2023 | O'donnell et al. |
| 2023/0194237 | A1 | 6/2023 | Schmitt et al. |
| 2023/0243897 | A1 | 8/2023 | Kubik et al. |
| 2023/0264198 | A1 | 8/2023 | O'donnell et al. |
| 2023/0275118 | A1 | 8/2023 | Canty et al. |
| 2023/0349987 | A1 | 11/2023 | O'donnell et al. |
| 2023/0375372 | A1 | 11/2023 | Schmitt et al. |
| 2023/0383855 | A1 | 11/2023 | O'donnell et al. |
| 2023/0404424 | A1 | 12/2023 | Sharma et al. |
| 2024/0003752 | A1 | 1/2024 | O'donnell et al. |
| 2024/0003753 | A1 | 1/2024 | O'donnell et al. |
| 2024/0003754 | A1 | 1/2024 | O'donnell et al. |
| 2024/0003755 | A1 | 1/2024 | O'donnell et al. |
| 2024/0003756 | A1 | 1/2024 | O'donnell et al. |
| 2024/0004001 | A1 | 1/2024 | Schmitt et al. |
| 2024/0019272 | A1 | 1/2024 | Schmitt et al. |
| 2024/0044725 | A1 | 2/2024 | O'donnell et al. |
| 2024/0044726 | A1 | 2/2024 | O'donnell et al. |
| 2024/0060796 | A1 | 2/2024 | Richard et al. |
| 2024/0085500 | A1 | 3/2024 | O'donnell et al. |
| 2024/0111005 | A1 | 4/2024 | Urs et al. |
| 2024/0111006 | A1 | 4/2024 | Necdet Urs et al. |
| 2024/0125872 | A1 | 4/2024 | Franco et al. |
| 2024/0210495 | A1 | 6/2024 | O'donnell et al. |
| 2024/0317300 | A1 | 9/2024 | Pathan |
| 2024/0318983 | A1* | 9/2024 | Schmitt ................ G01R 33/098 |

FOREIGN PATENT DOCUMENTS

| | | | |
|---|---|---|---|
| DE | 102008037975 | | 3/2009 |
| DE | 10 2010 022 611 | A1 | 12/2011 |
| DE | 102016212925 | A1 | 1/2018 |
| DE | 102018118258 | A1 | 1/2020 |
| DE | 102018130778 | A1 | 1/2020 |
| DE | 102018120419 | A1 | 2/2020 |
| DE | 102020114871 | A1 | 9/2021 |
| DE | 102020115906 | A1 | 9/2021 |
| DE | 102020108981 | A1 | 10/2021 |
| DE | 102020108982 | A1 | 10/2021 |
| DE | 102018222879 | B4 | 9/2022 |
| DE | 102021111644 | A1 | 11/2022 |
| DE | 102022102110 | A1 | 8/2023 |
| DE | 102022132777 | A1 | 6/2024 |
| EP | 3523608 | A1 | 8/2019 |
| EP | 3645980 | B1 | 5/2020 |
| JP | 4224033 | B2 | 2/2009 |
| TW | 202324801 | | 6/2023 |
| WO | WO 2018/028739 | A1 | 2/2018 |
| WO | WO 2018/149446 | A1 | 8/2018 |
| WO | WO 2018/224081 | A1 | 12/2018 |
| WO | WO 2023/016593 | A1 | 2/2023 |
| WO | WO 2023/147801 | A1 | 8/2023 |

OTHER PUBLICATIONS

Extended European Search Report in EP application No. 24200867.0, dated Jan. 30, 2025.

Semenova, Elena, et al. "Field operating window of nanodevices employing the domain wall propagation through the stripes intersection: Numerical optimization." Journal of Applied Physics 124.15 (2018).

* cited by examiner

Prior Art

MAGNETIC MULTI-TURN SENSOR

INCORPORATION BY REFERENCE TO ANY PRIORITY APPLICATIONS

This application claims the benefit of priority of U.S. Provisional Application No. 63/583,365 filed Sep. 18, 2023, the content of which is hereby incorporated by reference herein in its entirety. Any and all applications for which a foreign or domestic priority claim is identified in the Application Data Sheet as filed with the present application are hereby incorporated by reference under 37 CFR 1.57.

FIELD OF THE DISCLOSURE

The present disclosure relates to magnetic multi-turn sensors. In particular, the present disclosure relates to a divider structure for use in a magnetic multi-turn sensor.

BACKGROUND

Magnetic multi-turn sensors are commonly used in applications to monitor the number of times a device has been turned. An example is a steering wheel in a vehicle. Magnetic multi-turn sensors typically include magnetoresistance elements that are sensitive to an applied external magnetic field. The resistance of the magnetoresistance elements can be changed by rotating a magnetic field within the vicinity of the sensor. Variations in the resistance of the magnetoresistance elements can be tracked to determine the number of turns in the magnetic field, which can be translated to a number of turns in the device being monitored.

Magnet multi-turn sensors typically comprise a plurality of magnetoresistive elements laid out as a strip in a spiral or closed loop configuration.

Other magnetic multi-turn sensors make use of a divider type structure.

SUMMARY

Aspects of the present disclosure provide a magnetoresistive track for use in a magnetic multi-turn sensor, the magnetoresistive track comprising one or more looped sections. The looped sections can comprise a crossing where the magnetoresistive track crosses itself at substantially 90 degrees. In some cases, the looped portions may be further provided with syphon structures to prevent domain walls propagating around the magnetoresistive track as an external magnetic field rotates from becoming stuck at the crossing or propagating in the wrong direction at the crossing. By arranging the magnetoresistive track in accordance with one or more of these features, a fabrication complexity of the magnetoresistive track can also be reduced.

According to an aspect of the present disclosure, there is provided a magnetic multi-turn sensor, comprising: at least one magnetoresistive track, the magnetoresistive track extending in a closed loop configuration and comprising one or more looped sections; wherein each of the looped sections encloses a respective area; and wherein each of the looped sections comprises a first section of magnetoresistive track and a second section of magnetoresistive track, wherein the first section of magnetoresistive track and the second section of magnetoresistive track are configured to overlap at a crossing, a curved section of magnetoresistive track extending between the first section of magnetoresistive track and the second section of magnetoresistive track.

As such, the magnetoresistive track is provided with a plurality of loops where portions of the magnetoresistive overlap, to thereby provide cross-shaped junctions, rather than Y-shaped or U-shaped junctions. By providing a divider type structure with a plurality of looped sections, the problems associated with domain wall nucleation in the region of the crossing is reduced, compared to the domain wall nucleation that occurs in U-shaped or Y-shaped junctions. Furthermore, a fabrication complexity of the magnetoresistive track is also reduced compared to conventional U-shaped or Y-shaped junctions.

In an example, the magnetoresistive track encloses an area, and each of the looped sections extends from a perimeter of the enclosed area into a respective portion of the enclosed area. For example, each of the looped sections may enclose an area within the area enclosed by the magnetoresistive track. The magnetoresistive track may comprise a first looped section enclosing a first area, and a second looped section enclosing a second area. The first and second areas may be distinct from one another.

In an example, each of the looped sections comprises a divider structure for separating sections of the magnetoresistive track.

In an example, the magnetoresistive track comprises two or more looped sections. Each of the looped sections encloses a respective area. That is, each of the looped sections may enclose a separate portion of the internal area enclosed by the magnetoresistive track. In an example, the respective areas enclosed by respective looped portions may not overlap.

In an example, the magnetoresistive track may turn through 360 degrees in each of the looped sections, such that first section of magnetoresistive track is substantially perpendicular to the second section of magnetoresistive track.

In an example, the second section of magnetoresistive track may cross the first section of magnetoresistive track at a 90 degree angle. That is to say, the first and second sections of magnetoresistive track may cross to form a substantially X-shaped junction.

In an example, the magnetoresistive track may turn through 270 degrees between the first section and the second section.

In an example, each of the looped sections may further comprise one or more siphon sections, the one or more siphon sections being configured to restrict movement of magnetic domain walls through the crossing.

By providing the siphon sections, the magnetic domain walls propagating around the magnetoresistive track will propagate straight through the crossing, and are prevented from turning at the crossing or becoming stuck at the crossing. As such, domain walls are prevented from travelling in the wrong direction or nucleating at the crossing, which would otherwise lead to errors in the sensor output and an incorrect turn count.

In an example, the siphon sections may be arranged proximal to the first and/or second section of the magnetoresistive track.

In an example, the one or more siphon sections may comprise an S-shaped bend in the magnetoresistive track.

In an example, the magnetoresistive track may be provided in a first plane.

By providing the siphon sections to control the movement of the magnetic domain walls, the magnetoresistive track can be provided fully in a single plane, thus further reducing fabrication complexity.

In another example, the first section of magnetoresistive track may be arranged in a first plane and the second section of magnetoresistive track may be arranged in a second plane different to the first plane.

By providing the magnetoresistive track in two planes at the crossing, magnetic domain walls are prevented from turning or becoming stuck at the crossing, and will instead travel straight across the crossing as desired. As such, domain walls are prevented from travelling in the wrong direction or nucleating at the crossing, which would otherwise lead to errors in the sensor output and an incorrect turn count.

In one example, the magnetic turn sensor may further comprise a spacer layer provided between the first and second section of magnetoresistive track. For example, the spacer layer may be provided in the region of the crossing. In such cases, the spacer layer may be any suitable non-magnetic material. In doing so, the first and second sections of the magnetoresistive track in the region of the crossing are provided on different planes.

As another example, the substrate on which the magnetoresistive track is disposed may be formed with a bridge and trench arrangement in the region of the crossing, wherein one section of the magnetoresistive track is provided within the trench and another section of the magnetoresistive track is provided on a bridge that extends over the trench, such that the two sections of magnetoresistive cross over each other in two different planes.

In an example, the magnetic turn sensor may further comprise a plurality of looped sections arranged in-line or staggered along the magnetoresistive track.

It will be understood that magnetoresistive track may take a variety of configurations and can designed for different device space requirements. Further, when arranged in-line, a siphon section may be omitted between two consecutive looped sections.

In an example, the magnetic turn sensor may further comprise a plurality of magnetoresistive tracks, each magnetoresistive track comprising a different number of looped portions.

In doing so, the number of rotations of an external magnetic field that can be counted by the magnetic multi-turn sensor can be increased.

In an example, the plurality of magnetoresistive tracks may at least comprise a first magnetoresistive track and a second magnetoresistive track, wherein the second magnetoresistive track is arranged within the closed loop of the first magnetoresistive track.

By providing a second magnetoresistive track arranged within the closed loop of the first magnetoresistive track, the number of turns that can be counted is increased without significantly increasing the size of the sensor. It will however be appreciated that the magnetoresistive tracks may be arranged in any suitable way, for example, side by side.

In an example, the at least one magnetoresistive track may comprise a co-prime number of looped sections.

As such, the number of rotations of an external magnetic field which can be counted by a magnetic multi-turn sensor is increased to the product of the co-prime number of looped sections. For example, the multi-turn sensor may comprise the magnetoresistive tracks having a number of looped portions as set out in the examples below. It should however be understood that different numbers of looped portions may be provided and the multi-turn sensor described herein is not limited to the below examples.

In an example, the magnetic multi-turn sensor may comprise a plurality of magnetoresistive tracks respectively having 1, 2, 4, 6 looped portions providing a turn counting range of 2*3*5*7=210 turns.

In an example, the magnetic multi-turn sensor may comprise a plurality of magnetoresistive tracks respectively having 1, 4, 6, 10 looped portions providing a turn counting range of 2*5*7*11=770 turns.

In an example, the magnetic multi-turn sensor may comprise a plurality of magnetoresistive tracks respectively having 2, 4, 6, 10 looped portions providing a turn counting range of 3*5*7*11=1155 turns.

In an example, the magnetic multi-turn sensor may comprise a plurality of magnetoresistive tracks respectively having 4, 6, 10, 12 looped portions providing a turn counting range of 5*7*11*13=5005 turns.

In an example, the magnetic turn sensor may further comprise a plurality of electrical contacts arranged on the magnetoresistive track to thereby define a plurality of sensing elements.

In an example, the magnetic turn sensor may further comprise a plurality of straight sections, the plurality of straight sections separated by bends on the magnetoresistive track; and wherein the plurality of electrical contacts are provided on at least one of the straight sections of the magnetoresistive track.

In an example, the sensing elements may be arranged at an angle of between 0 and 90 degrees with respect to a reference direction of magnetoresistive track.

In this respect, the magnetoresistive track is provided with a reference layer having a magnetization pinned in a reference direction. As such, the sensing elements are arranged to that they extend in a direction that an angle of between 0 and 90 degrees relative to the reference direction.

In an example, the one or more sensing elements may be arranged at a 45 degree angle with respect to the reference direction.

In an example, the magnetic turn sensor may further comprise a plurality of sensing elements arranged on at least a portion of the respective plurality of straight sections of the magnetoresistive track at a period of 90 degrees.

In an example, the one or more sensing elements may be arranged parallel to a reference direction of the magnetoresistive track; and wherein the magnetoresistive track is longer in a direction parallel to the reference direction than in a direction perpendicular to the reference direction.

In an example, the magnetic turn sensor may further comprise at least one pair of sensing elements, the pair of sensing elements separated by an S-shaped section of the magnetoresistive track and configured to determine a direction of rotation of external magnetic field.

By separating the pair of sensing elements by the S-shaped section of magnetoresistive track, a rotation direction of the external magnetic field can be determined. The S-shaped section of magnetoresistive track is configured to act to slow propagation of magnetic domain walls, enabling a resistance change of each of the sensing elements to be detected a different times, thus enabling determination of the rotation direction.

In an example, the magnetic turn sensor may further comprise an initialization coil configured to apply a reset magnetic field to the magnetoresistive track to thereby initialize the magnetoresistive track into a known magnetization state.

In an example, the magnetic turn sensor may be one of a tunnel magnetoresistive sensor or a giant magnetoresistive sensor.

In an example, the magnetic multi-turn sensor may further comprise a substrate on which the magnetoresistive track is disposed. In one example, the one or more magnetoresistive tracks may be disposed on a substrate, such as a printed circuit board (PCB) comprising processing circuitry for processing the sensor signal. It will also be appreciated that the magnetoresistive track may be a giant magnetoresistive (GMR) or tunnel magnetoresistive (TMR) film.

According to a further aspect of the present disclosure, there is provided a magnetic multi-turn sensor, comprising at least two magnetoresistive tracks, each of the magnetoresistive tracks extending in a closed loop configuration and comprising one or more looped sections; wherein each of the looped sections comprises a first section of magnetoresistive track and a second section of magnetoresistive track, wherein the first section of magnetoresistive track and the second section of magnetoresistive track are configured to overlap at a crossing, a curved section of magnetoresistive track extending between the first section of magnetoresistive track and the second section of magnetoresistive track; and wherein each of the magnetoresistive tracks comprises a different number of looped sections.

BRIEF DESCRIPTION OF THE DRAWINGS

The present disclosure will now be described by way of example only with reference to the accompanying drawings.

DETAILED DESCRIPTION

Magnetic multi-turn sensors can be used to monitor the turn count of a rotating shaft. To do this, a magnet is typically mounted to the end of the rotating shaft, the multi-turn sensor being sensitive to the rotation of the magnetic field as the magnet rotates with the shaft. Such magnetic sensing can be applied to a variety of different applications, such as automotive applications, medical applications, industrial control applications, consumer applications, and a host of other applications which require information regarding a position of a rotating component.

Magnetic multi-turn sensors typically include giant magnetoresistive (GMR) elements or tunnel magnetoresistive (TMR) elements that are sensitive to an applied external magnetic field arranged in a spiral or closed loop configuration.

Figure 1:
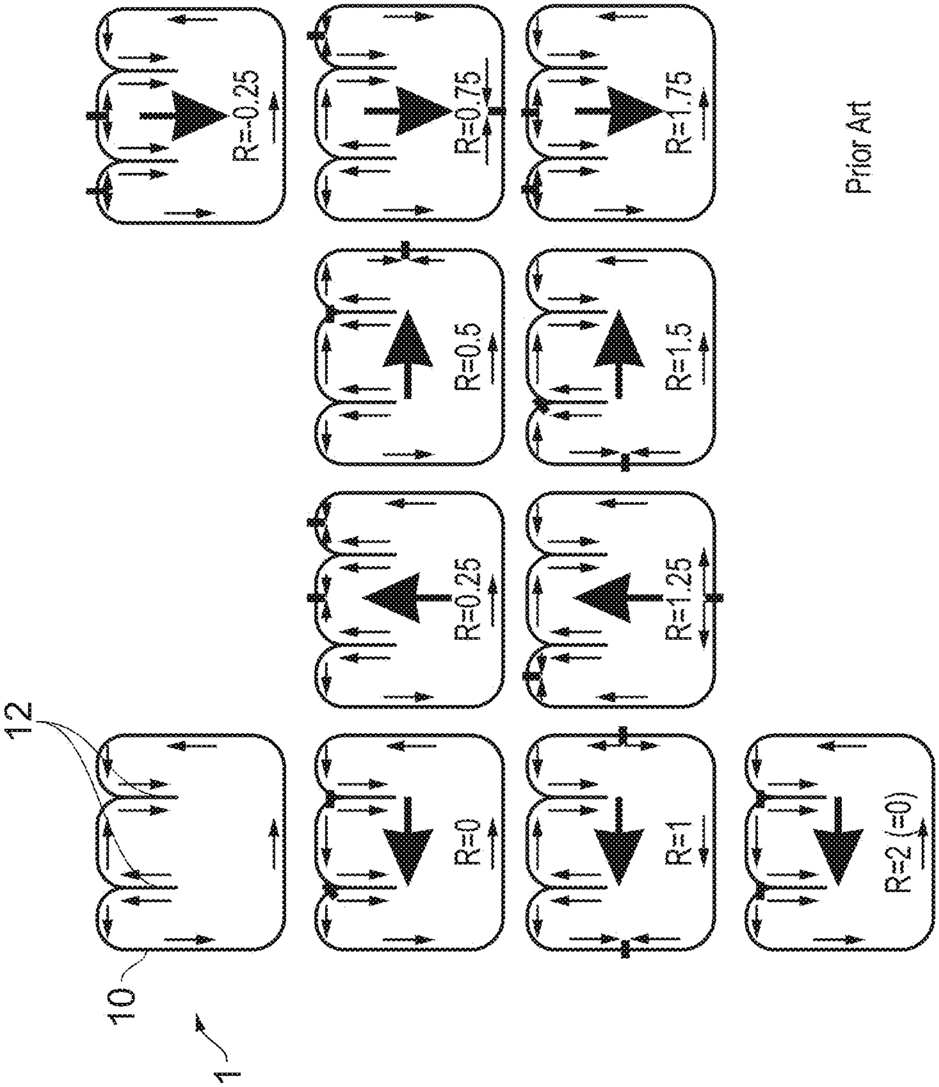
FIG. 1 illustrates a divider type magnetic structure and its operation according to prior art.

Another type of magnetic multi-turn sensor 1 makes use of a divider type structure, as illustrated by FIG. 1. Here, the magnetoresistive track 10 is laid out in at least one closed loop with a plurality of divider loops along at least one side of the closed loop. As shown in FIG. 1, domain walls propagate around the magnetoresistive track 10 as an external magnetic field (denoted by the large arrow) rotates, such that the magnetization states of each section of the track 10 (denoted by the small arrows) change with magnetic field rotation. It should be understood that reference to a rotation of an external magnetic field means a relative rotation of the magnetic multi-turn sensor 1 and the external magnetic field. That is, the magnetic multi-turn sensor 1 may also rotate in the presence of a fixed external magnetic field.

In these divider type structures for use in a magnetic multi turn sensor, the divider loops include a plurality of 'dead ends' 12. In this regard, the dead ends 12 are proceeded by two curved magnetoresistive tracks meeting to create a Y-shaped junction 30, as further illustrated by FIG. 3.

As the domain walls are propagating around the divider type sensor 1, the domain walls are split into two domain walls (e.g., when they are somewhere along a loop). After one rotation, one of the domain walls will propagate along the dead end 12 and disappear at the tip, whilst the other will be stopped around the Y-junction 30 and then released after an additional rotation. The number of dead ends 12 and Y-junctions 30 in the divider type structure thus determines the amount of turns a magnetic field needs to be rotated to get back to the original state.

Figure 2:
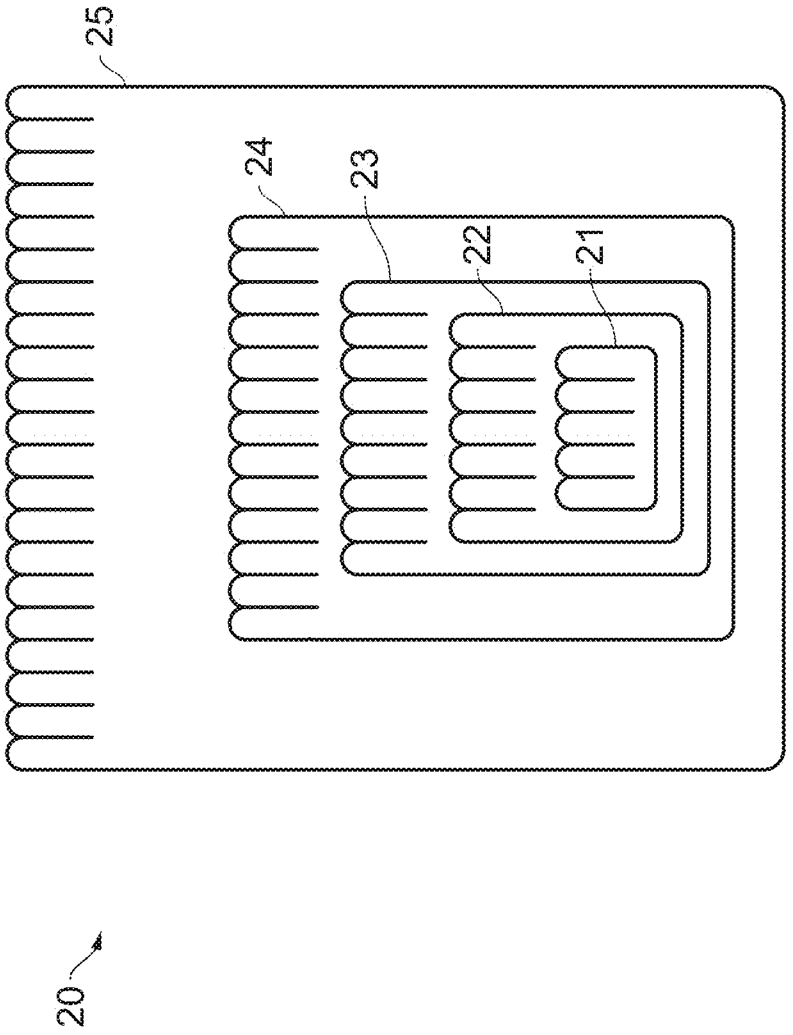
FIG. 2 further illustrates a magnetic multi-turn sensor including a plurality of divider structures according to the prior art.

Consequently, these structures can be used to measure counts of a rotating field. The limitation of counts for a single loop 10 is given by the number, N, of dead ends 12 added to the loop 10. Thus, it needs N+1 turns to return to the original magnetic state. As illustrated by the multi-turn sensor 20 shown in FIG. 2, by combining multiple of these divider structures 21-25 with prime numbers of count ranges (i.e., as defined by the number of dead ends), the overall count ranges can be enhanced. In this respect, the resulting count range is a multiplication of the individual count range of each structure 21-25.

Figure 3:
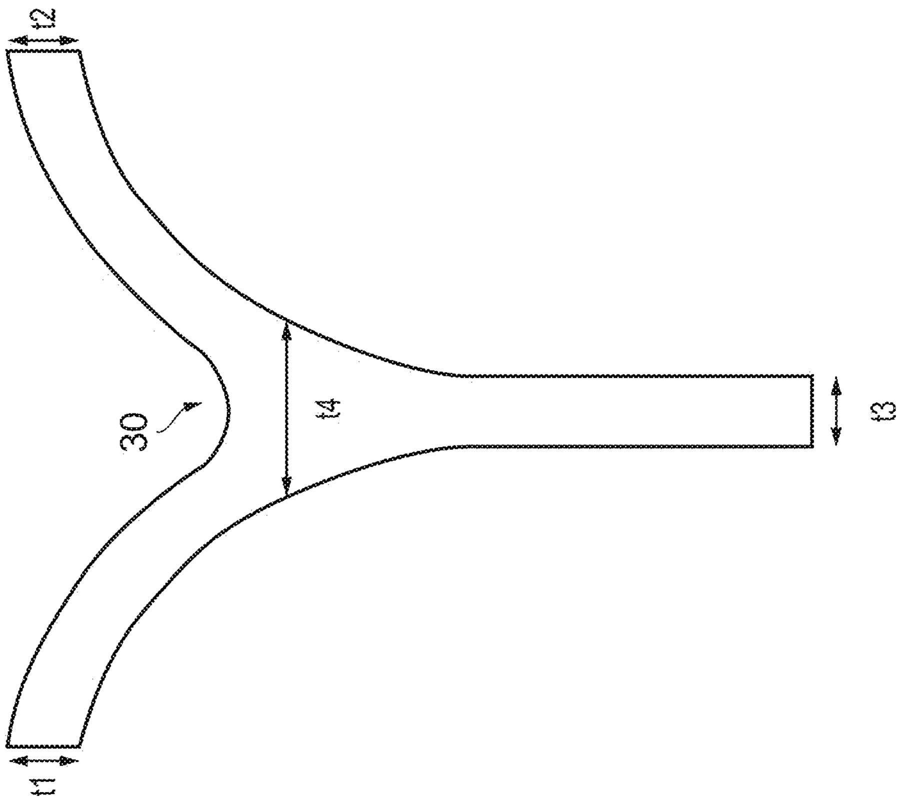
FIG. 3 Prior Art
FIG. 3 illustrates a portion of a divider structure according to the prior art.

However, one of the main problems with this divider structure is the area where two arms of each dividing loops join, i.e., the Y-junction 30 shown in FIG. 3. The width of the Y-junction track, t4, can be up to twice as wide, or at least substantially wider, as the tracks in other areas of sensor, t1, t2, and t3. Additionally, there is often a rounding of the magnetoresistive material at the Y-junction 30. As such, the Y-junction causes a lack of width uniformity in the magnetoresistive track.

As a result, the shape anisotropy is significantly reduced in this Y-junction area such that domain wall nucleation at lower magnetic fields compared to the other areas of the sensor is inevitable in these regions, which limits the useful magnetic window of operation. That is to say, at lower magnetic fields, domain walls will more readily nucleate in these Y-junctions, causing the sensor to operate incorrectly.

Magnetic multi-turn sensors may include U-shaped structures as well as or instead of the Y-shaped junctions. However, each of the U-shaped structures needs a full 360 degree rotation of magnetic field to propagate the domain walls through the structure. It can be difficult to fabricate a U-shaped structure or Y-junction with a correct shape and having an acceptable magnetic window for domain wall propagation.

Aspects of the present disclosure aim to overcome these problems by providing a magnetic multi-turn sensor with a divider type structure in which a plurality of looped sections are provided along a magnetoresistive track, the looped portions providing the divider structure. The looped sections can replace the U-shaped structures of magnetic multi-turn sensors. Each of the looped sections can include a cross-shaped junction, where the magnetoresistive track crosses over itself at substantially 90 degrees. The cross-shaped junctions or crossings are of a significantly lower fabrication complexity compared to Y-junctions, and thus manufacture of the magnetic multi-turn sensor can be simplified. In some examples, instead of a planar or substantially planar cross-shaped junction, the magnetoresistive track may cross over itself at substantially 90 degrees via an over/under-path where the magnetoresistive track is provided in two separate planes at the point of crossing. That is, the magnetoresistive track may be provided to turn to approach a preceding section of the magnetoresistive track, and may change plane before crossing over itself, such that a first section of the magnetoresistive track extends in a first direction in a first plane, and a second section of the magnetoresistive track crosses the first section in a second direction substantially perpendicular to the first direction, where the second section of the magnetoresistive track is provided in a second plane different to the first plane. For example, a spacer layer may be provided between the first and second sections of magnetoresistive track in the region of the crossing. As another example, the substrate on which the magnetoresistive track is disposed may be formed with a bridge and trench arrangement in the region of the crossing, wherein one section of the magnetoresistive track is provided within the trench and another section of the magnetoresistive track is provided on a bridge that extends over the trench, such that the two sections of magnetoresistive cross over each other in two different planes. In doing so, the domain wall pairs may be prevented from turning and are able to proceed across the junction or crossing due to the separation of the first and second sections of magnetoresistive track.

Figure 4:
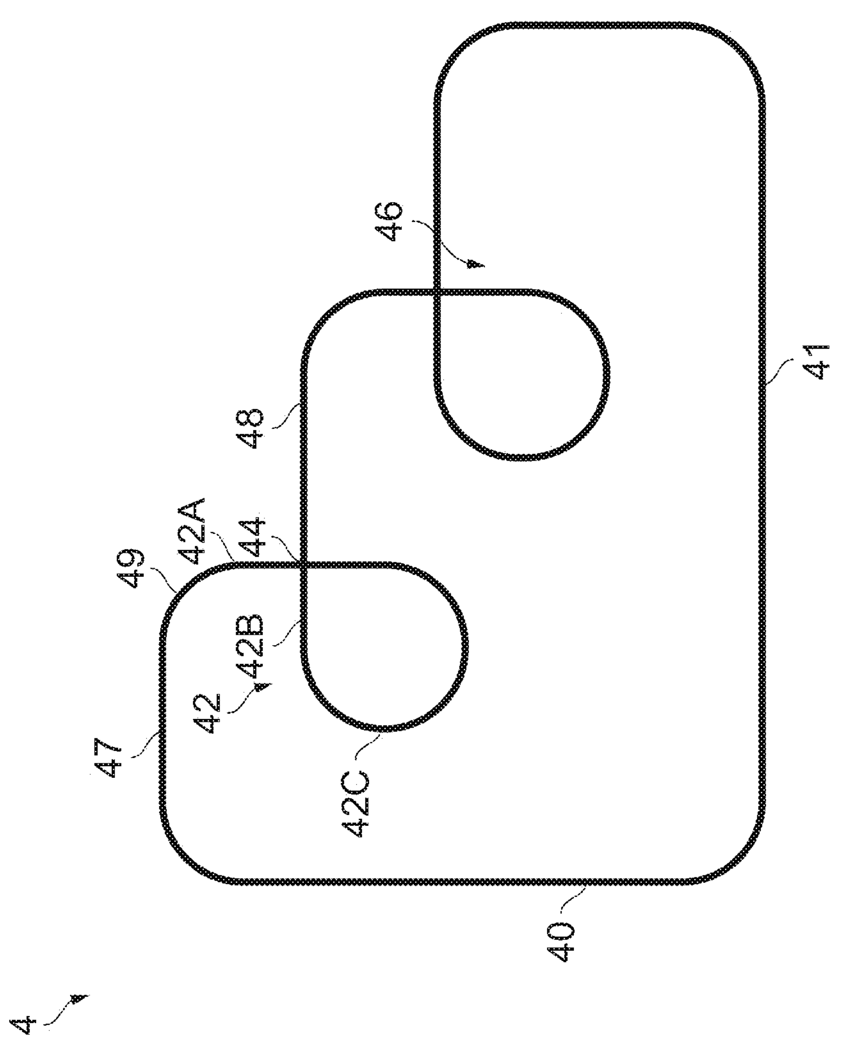
FIG. 4 illustrates a magnetoresistive track of a magnetic multi-turn sensor according to one embodiment.

FIG. 4 illustrates a magnetoresistive track 4 for use in a magnetic multi-turn sensor according to one embodiment. The magnetoresistive track 4 extends in a closed loop configuration and comprises at least one straight section 40, 41 and at least one looped section 42, 46. The magnetoresistive track 4 shown in FIG. 4 comprises two looped sections 42, 46, but it should be understood that any number of looped sections may be provided.

Each of the looped sections 42, 46 of the magnetoresistive track 4 comprise a first section 42A of magnetoresistive track 4, a second section 42B of magnetoresistive track 4, a curved section 42C of magnetoresistive track 4 and a crossing 44 or junction at which the first and second sections 42A, 42B overlap, the first and second sections 42A, 42B being substantially straight portions of magnetoresistive track 4. The first section 42A of magnetoresistive track 4 may be understood as an entry section of the magnetoresistive track 4 which defines a beginning of the looped section 42, 46. The first section 42A of the magnetoresistive track 4 may extend in a substantially straight line in a first direction. The second section 42B of magnetoresistive track 4 may be understood as an exit section of the magnetoresistive track 4 which defines an end of the looped section 42, 46. The second section 42B of magnetoresistive track 4 may extend in a substantially straight line in a second direction. The second direction may be substantially perpendicular to the first direction, and the second section 42B of magnetoresistive track 4 may cross the first section 42A of the magnetoresistive track 4 at the crossing 44. The first section 42A may be connected to the second section 42B by the curved section 42C of magnetoresistive track 4, such that in the curved section 42C, the magnetoresistive track 4 may be arranged to turn so that the second section 42B extends substantially perpendicularly toward the first section 42A and crosses the first section 42A at the crossing. Therefore, the magnetoresistive track 4 may turn through 270 degrees in the curved section 42C.

As noted above, the crossing 44 may also be known as a junction. The crossing 44 may be a cross-shaped crossing where the first and second sections 42A, 42B of the magnetoresistive track 4 meet at a 90 degree angle to each other. That is to say, the first section 42A and the second section 42B of the magnetoresistive track 4 cross to form a substantially X-shaped junction. As will be explained below, the crossing 44 may be arranged so that magnetic domain walls can only travel straight across the crossing 44. That is, the crossing 44 may be arranged so that magnetic domain walls cannot turn at the crossing 44, and will travel between the first and second sections 42A, 42B via the looped portion 42C. It should be understood that in some examples, the second section 42B of magnetoresistive track 4 and the first section 42A of magnetoresistive track 4 at the crossing 44 are perpendicular to each other. However, in other examples, the first and second sections 42A, 42B may cross at a different angle to each other, that is, the angle of crossing may not be exactly 90 degrees, but may be similar.

The looped sections 42, 46 of the magnetoresistive track 4 may be arranged as follows. The magnetoresistive track 4 may comprise a connecting section 47 provided proximal to a looped section 42. The connecting section 47 may be a straight or substantially straight section of the magnetoresistive track 4 as shown in FIG. 4, although the present disclosure is not limited thereto. The magnetoresistive track 4 may comprise a second connecting section 48 separated from the first connecting section 47 by the looped section 42. The first and second connecting sections 47, 48 extend in the same direction, such that the magnetoresistive track 4 turns through a full 360 degrees in the looped section 42. As shown in FIG. 4, the magnetoresistive track 4 may comprise a corner section 49 where the magnetoresistive track 4 turns through 90 degrees prior to the first section 42A of the looped section 42. Thus, the magnetoresistive track 4 may turn through 360 degrees between the first and second connecting sections 47, 48, and the second connecting section 48 may be laterally offset from the first connecting section 47. That is, the second connection section 48 may extend substantially parallel to the first connecting section 47. By arranging the magnetoresistive track 4 in such a way, the crossing 44 where the magnetoresistive track 4 crosses itself is arranged in a cross-shape where the magnetoresistive track 4 crosses itself at 90 degrees.

Each of the looped sections 42, 46 may be arranged to enclose a respective area. That is, each of the looped sections 42, 46 may enclose an area which is separate and distinct to an area enclosed by another looped section 42, 46. In the example of FIG. 4, the first looped section 42 encloses a first area and the second looped section 46 encloses a second area. The first and second enclosed areas of the example of FIG. 4 do not overlap. Further, each of the looped sections 42, 46 may enclose an area internal to an area enclosed by the magnetoresistive track 40. That is, each of the looped sections 42, 46 may extend from an outer perimeter of an area enclosed by the magnetoresistive track 40 into an internal area of the area enclosed by the magnetoresistive track 40.

As will be described further below, the magnetoresistive track 4 may be provided with a plurality of electrical contacts for sensor read-out, such that a plurality of sensing elements are defined between each electrical contact.

By arranging the magnetoresistive track 4 in this way, domain wall nucleation may be reduced in cross-shaped junctions 44 compared to the previously used Y-shaped or U-shaped junctions. Furthermore, a lower fabrication complexity is achieved compared to prior art magnetic multi-turn sensors because the cross-shaped junctions 44 have a significantly easier to fabricate using known deposition and etching techniques, compared to previously used Y-shaped or U-shaped junctions.

The magnetoresistive track 4 may be formed from a magnetoresistive film comprising a stack of layers, the film at least comprising a substrate, a reference layer and a free layer. The free layer may be a ferromagnetic layer that is free to align its magnetization with an external field. It should be understood that the free layer may be formed of multiple ferromagnetic layers, for example, a CoFe layer followed by a nickel iron (NiFe) layer. The free layer may be provided on the pinned reference layer. The pinned reference layer may comprise a plurality of layers. The pinned reference layer may comprise a ferromagnetic material having a magnetisation that is pinned in a reference direction. A change in film resistance is thus observed when magnetisation direction of the free layer relative to the direction of magnetisation of the pinned layer changes between parallel and anti-parallel (for example, due to a change in the relative orientation of the free layer and an external magnetic field). The magnetoresistive track 4 is formed to allow magnetic domain walls to propagate around the magnetoresistive track 4.

Figure 5:
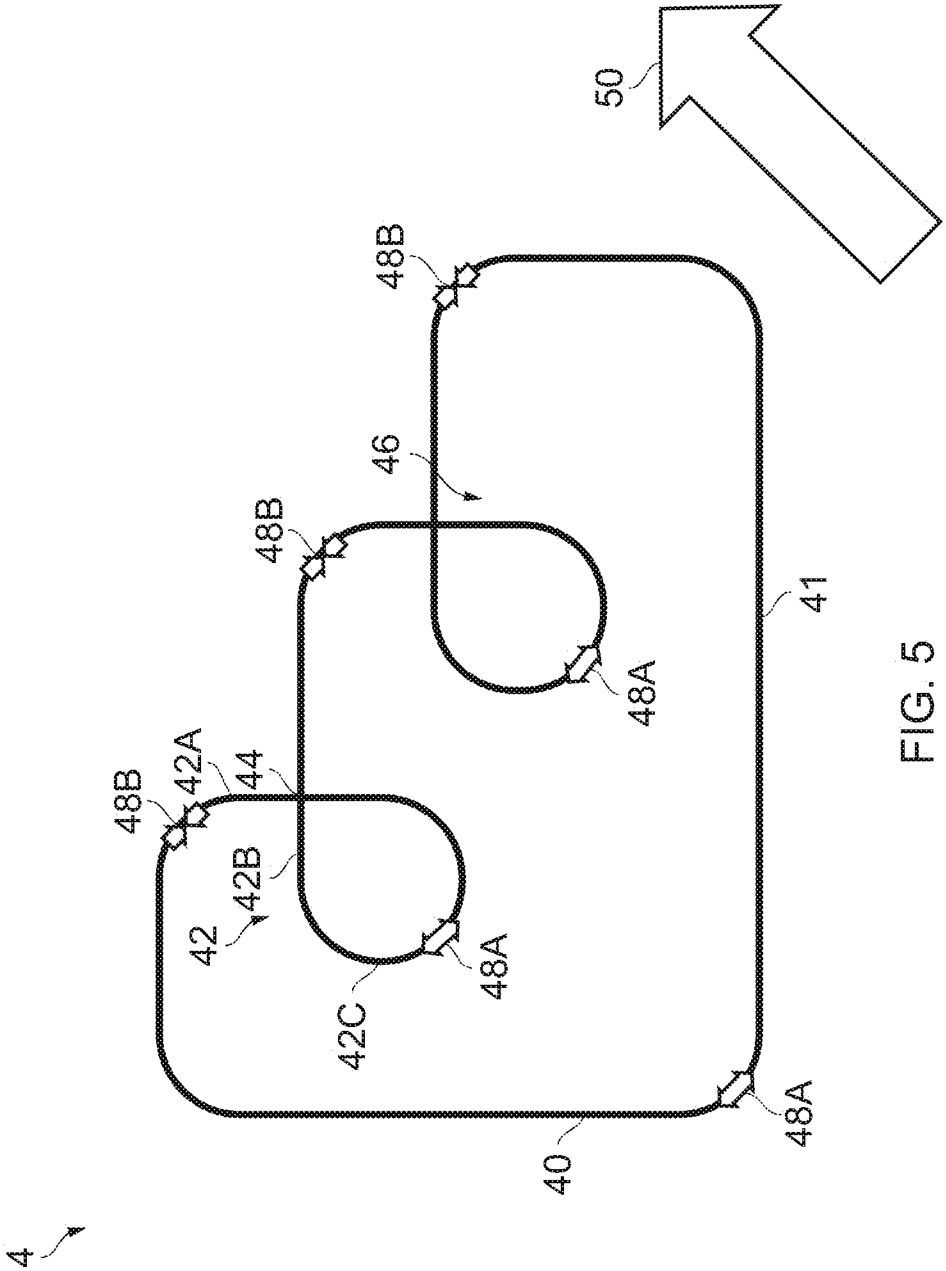
FIG. 5 further illustrates a magnetoresistive track of a magnetic multi-turn sensor according to another embodiment.

FIG. 5 illustrates an example initialization process for initializing the magnetoresistive track 4 of FIG. 4 for in use in a magnetic multi-turn sensor, wherein a reset field 50 is applied to the magnetoresistive track 4. As discussed above, the magnetoresistive track 4 may be provided with a reference pinned layer having a fixed magnetization direction and a free layer having a magnetization that is free to change direction when an external magnetic field is applied. The reset field 50 is a strong magnetic field that may be generated by applying a current to an external device, such as a coil or wire that is electrically isolated above or below the magnetoresistive track 4. When the reset field 50 is applied to the magnetoresistive track 4, a plurality of magnetic domain walls 48A, 48B are formed in the corners of the magnetoresistive track 4, thereby magnetizing the free layer of the sensing elements of the magnetoresistive track 4 into a known state, e.g., all of the sensing elements provide either a high or low resistance reading, or a half-high and half-low reading, depending on the direction of the applied reset field 50 relative to the magnetization direction of the reference pinned layer. The magnetic domain walls 48A, 48B may comprise pairs of magnetic domain walls, as illustrated by the tail-to-tail arrows 48A and the head-to-head arrows 48B in FIG. 5.

After the reset magnetic field 50 is applied, there may be n domain wall pairs in a magnetoresistive track comprising n turns. In the presence of an external rotating magnetic field (e.g., generated by a magnet coupled to a rotating mechanical system), the domain walls are caused to propagate around the magnetoresistive track 4, resulting in changes in the measured resistance of each sensing element, due to the change in the magnetization direction of the free layer relative to the pinned reference layer as explained above. Therefore, in the case where there are n domain wall pairs, the domain wall state would be reset after a single turn of the external rotating magnetic field, i.e., the resistances measured across each sensing element would repeat itself after each turn and thus sensor would only be able to count one full turn of rotation. Therefore, it is desirable to remove one or more of the magnetic domain wall pairs. To do this, one or more coils may be used to energize one or more parts of the magnetoresistive track 4 to provide localized annihilation of at least one magnetic domain wall pair. In some cases, all of the domain wall pairs except one domain wall pair may be removed.

Figure 6B:
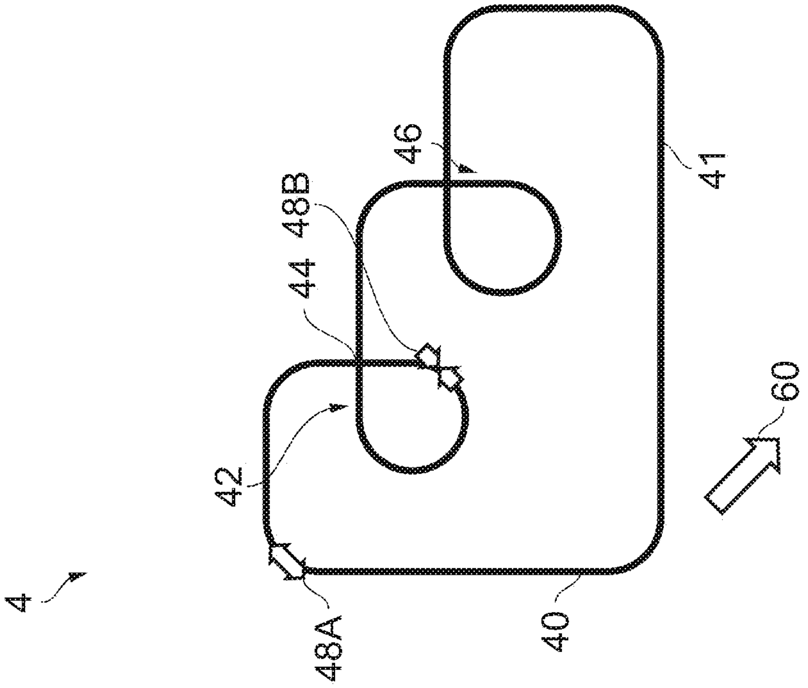
FIG. 6B illustrates another example of movement of magnetic domain walls around a magnetoresistive track of a magnetic multi-turn sensor according to one embodiment.
Figure 6A:
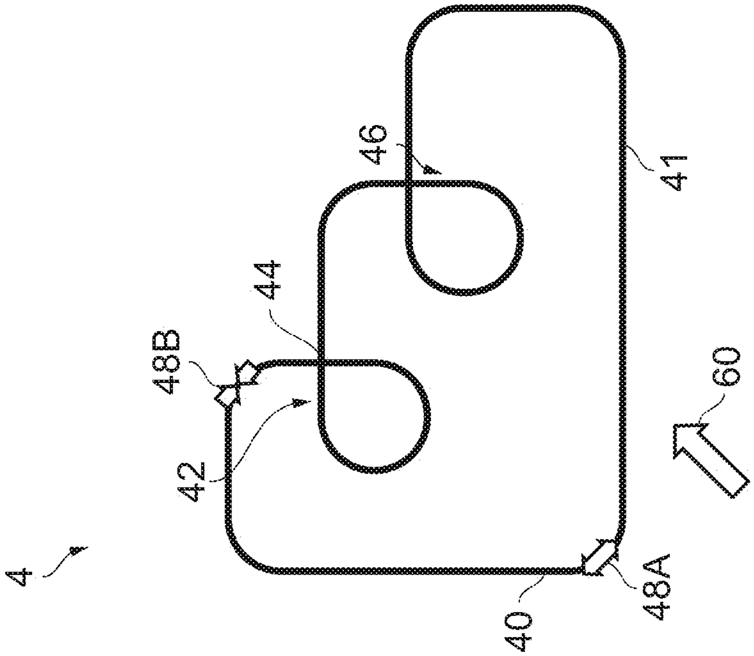
FIG. 6A illustrates one example of movement of magnetic domain walls around a magnetoresistive track of a magnetic multi-turn sensor according to one embodiment.

FIGS. 6A-6L shows the magnetoresistive track 4 in use in a magnetic multi-turn sensor after an initialization process has been performed such that there are two domain walls 48A, 48B arranged in the magnetoresistive track 4. The initialization process may be performed as explained above in respect of FIG. 5, by applying the reset field 50 to fill the magnetoresistive track 4 with magnetic domain walls to initialize the magnetoresistive track 4 into a known state, and then removing one or more of the magnetic domain wall pairs. As described above, in the initialized state, the magnetoresistive track 4 comprises having a single domain wall pair 48A, 48B, as shown in FIG. 6A, or having n−1 magnetic domain wall pairs, where n is the number of turns in the magnetoresistive track 4. In either of these states, the illustrated magnetoresistive track 4 will have a different magnetic state and thus different resistance read-out with every 90 degree turn of an external magnetic field 60. Each of these state changes can be detected by one or more resistors provided along the magnetoresistive track 4, as will be explained below.

FIGS. 6A-6L illustrate the rotation of an external magnetic field 60 and the consequential movement of a magnetic domain wall pair 48A, 48B around the magnetoresistive track 4.

Figure 6D:
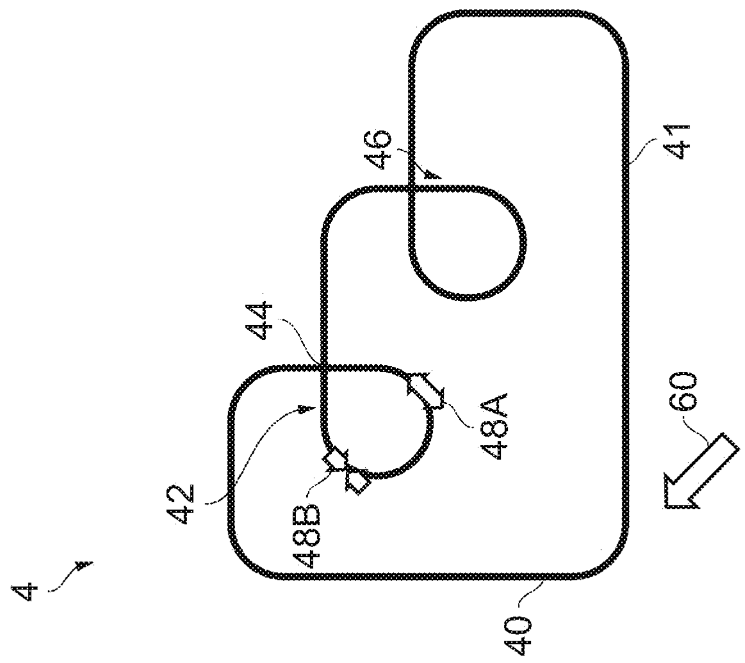
FIG. 6D illustrates another example of movement of magnetic domain walls around a magnetoresistive track of a magnetic multi-turn sensor according to one embodiment.
Figure 6C:
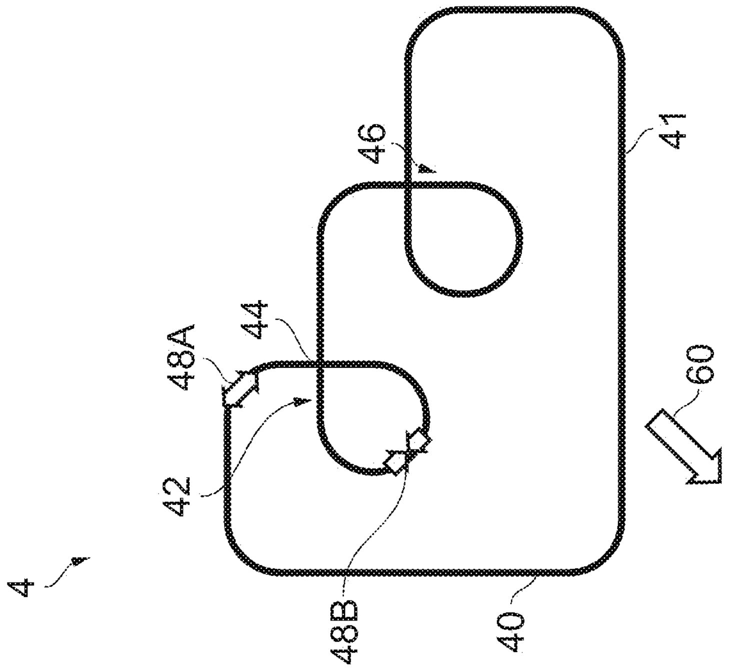
FIG. 6C illustrates another example of movement of magnetic domain walls around a magnetoresistive track of a magnetic multi-turn sensor according to one embodiment.
Figure 6F:
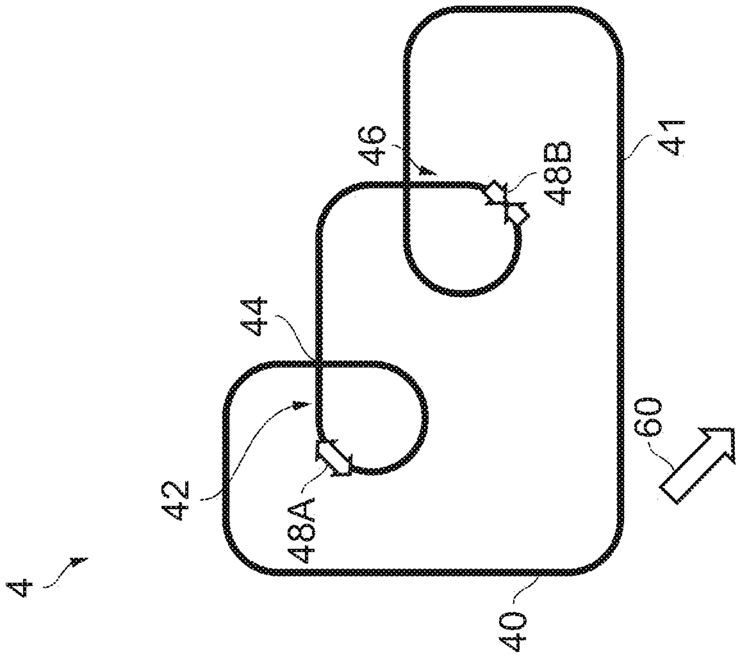
FIG. 6F illustrates another example of movement of magnetic domain walls around a magnetoresistive track of a magnetic multi-turn sensor according to one embodiment.

FIGS. 6A-6D illustrate a first turn of the external magnetic field 60. FIG. 6A illustrates the external magnetic field 60 at a 45 degree angle relative to the magnetoresistive track 4. FIG. 6B illustrates the external magnetic field 60 at a 135 degree angle relative to the magnetoresistive track 4, where for example the magnetic field 60 has rotated 90 degrees clockwise from FIG. 6A. FIG. 6C illustrates the external magnetic field 60 at a 225 degree angle relative to the magnetoresistive track 4, where for example the magnetic field 60 has rotated 90 degrees clockwise from FIG. 6B. FIG. 6D illustrates the external magnetic field 60 at a 315 degree angle relative to the magnetoresistive track 4 at a 315 degree angle to the external magnetic field 60, where for example the magnetic field 60 has rotated 90 degrees clockwise from FIG. 6C.

Figure 6E:
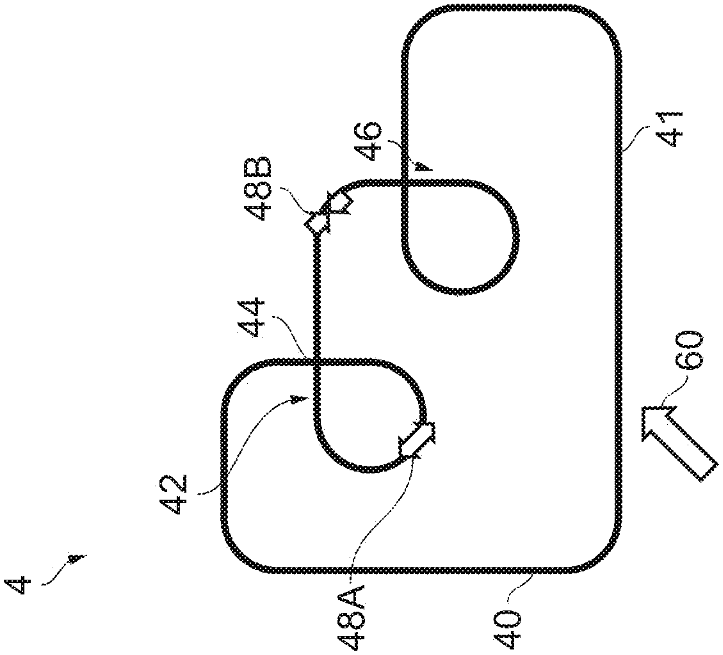
FIG. 6E illustrates another example of movement of magnetic domain walls around a magnetoresistive track of a magnetic multi-turn sensor according to one embodiment.
Figure 6H:
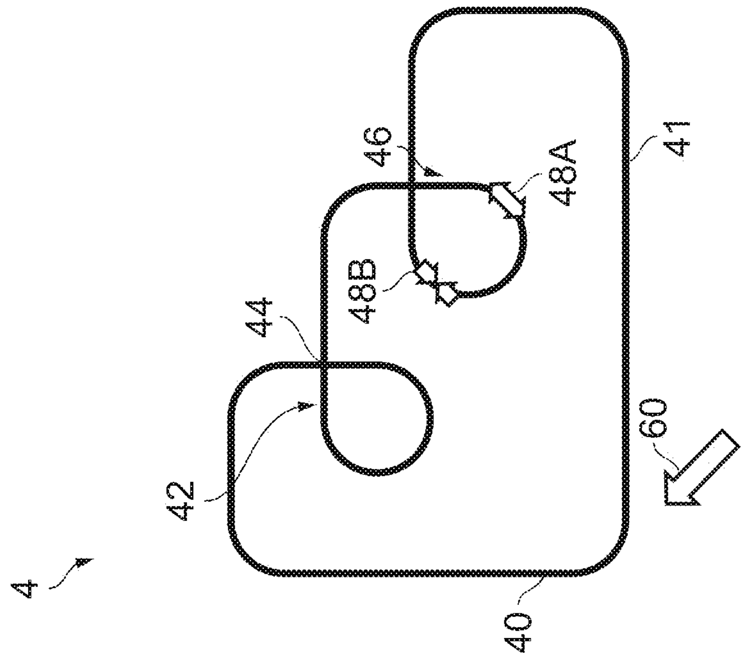
FIG. 6H illustrates another example of movement of magnetic domain walls around a magnetoresistive track of a magnetic multi-turn sensor according to one embodiment.
Figure 6G:
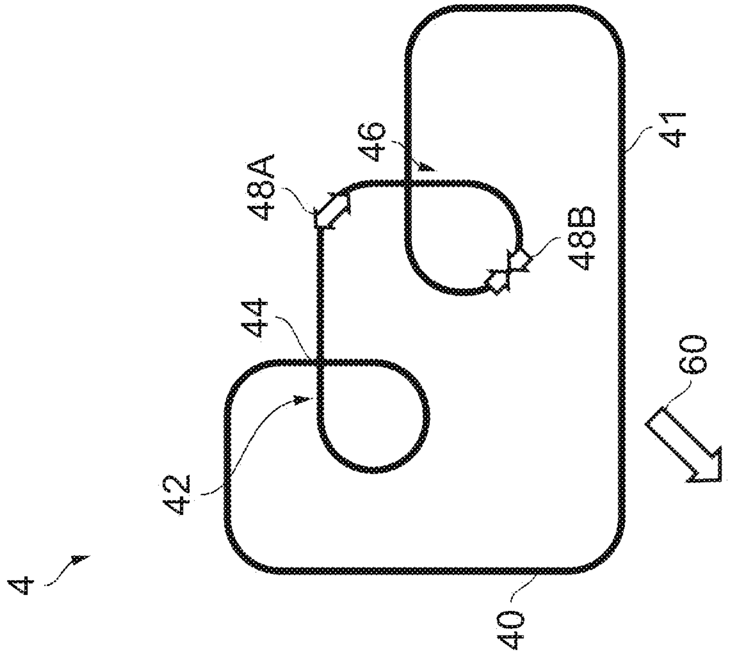
FIG. 6G illustrates another example of movement of magnetic domain walls around a magnetoresistive track of a magnetic multi-turn sensor according to one embodiment.
Figure 6J:
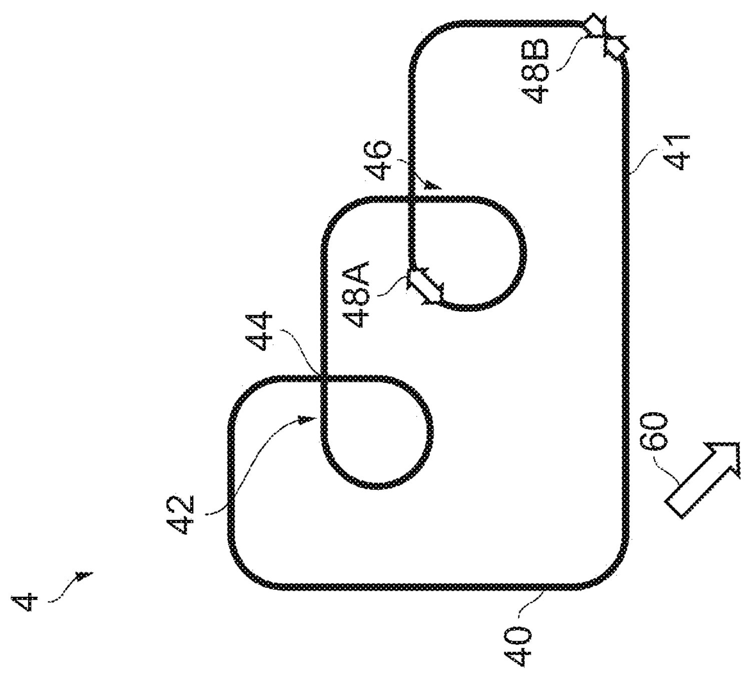
FIG. 6J illustrates another example of movement of magnetic domain walls around a magnetoresistive track of a magnetic multi-turn sensor according to one embodiment.
Figure 6I:
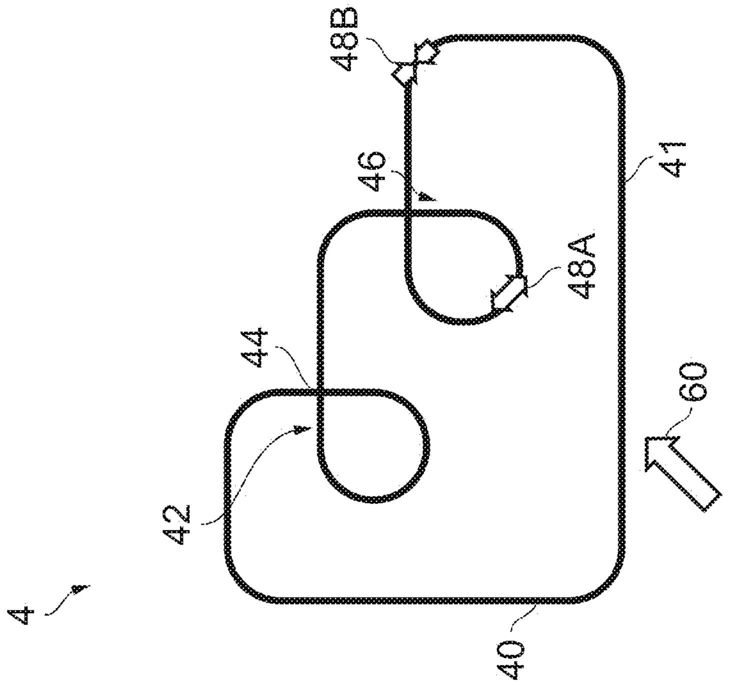
FIG. 6I illustrates another example of movement of magnetic domain walls around a magnetoresistive track of a magnetic multi-turn sensor according to one embodiment.
Figure 6L:
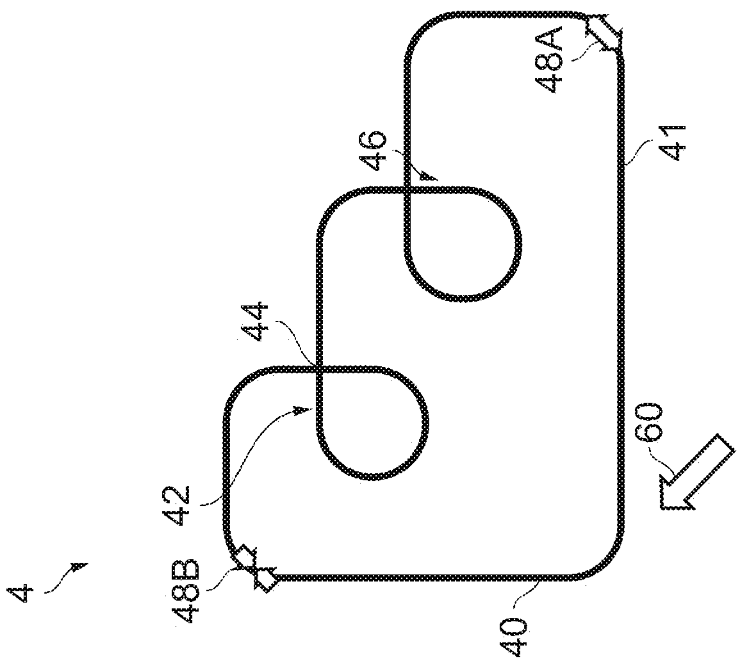
FIG. 6L illustrates another example of movement of magnetic domain walls around a magnetoresistive track of a magnetic multi-turn sensor according to one embodiment.
Figure 6K:
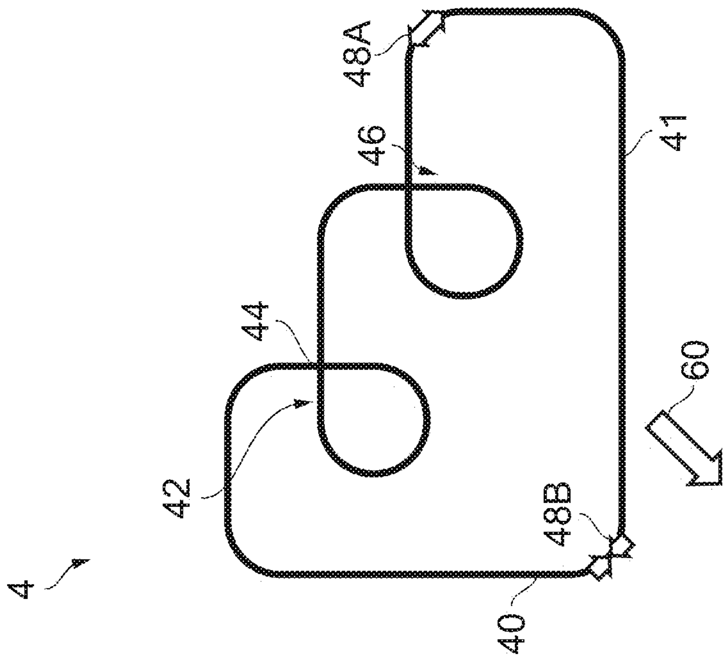
FIG. 6K illustrates another example of movement of magnetic domain walls around a magnetoresistive track of a magnetic multi-turn sensor according to one embodiment.

FIG. 6E illustrates the external magnetic field 60 at a 45 degree angle relative to the magnetoresistive track 4, where for example the magnetic field 60 has rotated a further 90 degrees clockwise from FIG. 6D. FIG. 6E illustrates the position of the magnetic domain wall pair 48A, 48B after a full rotation of the magnetic field 60 of FIG. 6A relative to the external magnetic field 60. FIGS. 6F-6L each illustrate further 90 degree rotations of the external magnetic field 60 relative to the magnetic multi-turn sensor comprising the magnetoresistive track 4. FIG. 6L illustrates the state of the magnetic multi-turn sensor comprising the magnetoresistive track 4 after 3 full rotations of the external magnetic field 60. The magnetic multi-turn sensor returns to the same state as in FIG. 6A after 3 full rotations.

It should be understood that the number of rotations which can be counted by the magnetic multi-turn sensor is dependent on the number of turns, and consequently the number of looped sections 42, 46, of the magnetoresistive track 4, as this defines the number of different magnetic states of the sensing elements as the magnetic domain wall pairs 48A, 48B propagate around the sensor track 4. The present disclosure is not limited to the number of looped sections 42, 46 illustrated in the Figures, and therefore is also not limited to a magnetic multi-turn sensor for counting 3 rotations, but may also include a magnetic multi-turn sensor for counting a different number of rotations.

Figure 7:
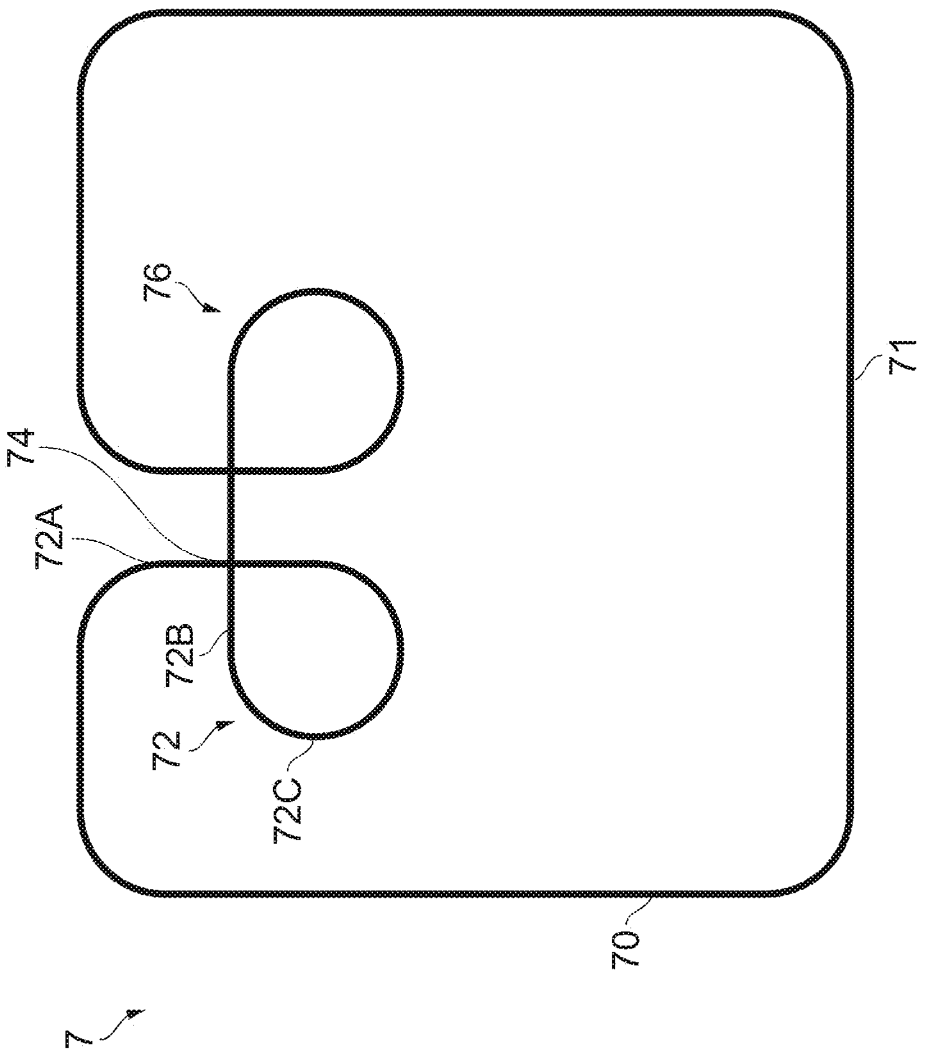
FIG. 7 illustrates a magnetoresistive track of a magnetic multi-turn sensor according to another embodiment.

FIG. 7 illustrates another configuration of a magnetoresistive track 7. The magnetoresistive track 7 of FIG. 7 also includes a plurality of straight sections 70, 71 and a plurality of looped sections 72, 76, each of the looped sections comprising a first section 72A of magnetoresistive track 7, a second section 72B of magnetoresistive track 7 arranged to cross the first section 72A at 90 degrees at a crossing 74 and connected to the first section 72A by a curved section 72C. Thus, the magnetoresistive track 7 has common features with the magnetoresistive track 4 of FIGS. 4-6L, and a detailed description of common features is omitted for brevity.

The magnetoresistive track 7 of FIG. 7 differs from the magnetoresistive track 4 of FIG. 4 in the arrangement of the plurality of looped sections 72, 76. In the magnetoresistive track 7 of FIG. 7, two looped sections 72, 76 are arranged in-line, while the looped sections 42, 46 of FIG. 4 are staggered. It should be understood that the precise location of the crossing 74 relative to the looped sections 72, 76 is not limited to the locations shown in the Figures. For example, considering the magnetoresistive track 7 of FIG. 7, the number of rotations of an external magnetic field that can be counted is the same as explained above for the magnetoresistive track 4 of FIGS. 4-6L. However, if an individual looped section, such as the second looped section 76 of FIG. 7, is rotated by 90 degrees, then magnetic domain walls passing through will enter and exit the looped section 76 with a 90 degree phase difference to in the magnetoresistive track 4 of FIGS. 4-6L.

In both the magnetoresistive track 4 of FIGS. 4-6L, it should be understood that the location of the looped sections 42, 46, 72, 76 may be different to that illustrated in the Figures. For example, while in these embodiments the looped sections 42, 46, 72, 76 are shown along a top edge of a substantially rectangular magnetoresistive track 4, 7, the looped sections 42, 46, 72, 76 may be provided along a different edge or a plurality of edges of the magnetoresistive track 4, 7.

Figure 8:
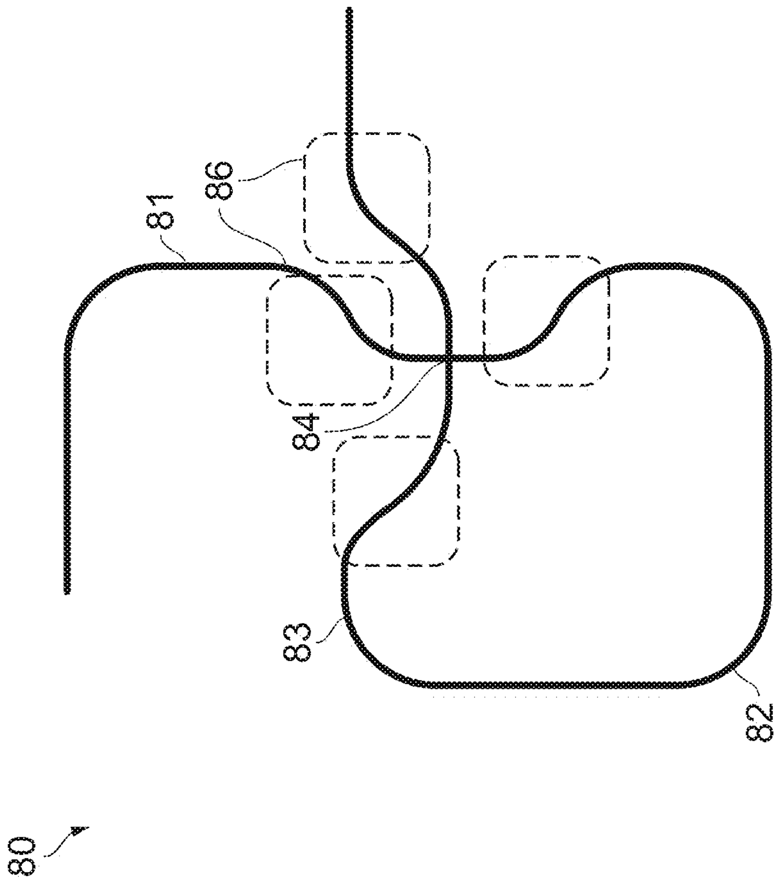
FIG. 8 illustrates a looped portion of a magnetoresistive track with a siphon structure according to one embodiment.

FIG. 8 illustrates a looped section 80 of a magnetoresistive track with a siphon structure 86 according to one embodiment. As has been discussed above, magnetic domain walls may propagate around the magnetoresistive track as an external magnetic field is rotated relative to the magnetoresistive track rotates. The magnetic domain walls may travel through a crossing 84 where a first section 81 of the looped section 80 and a second section 83 of the looped section 80 cross each other at substantially 90 degrees. As explained previously, the first section 81 and the second section 83 of the looped section 80 are connected via a curved section 82 of the magnetoresistive track.

As shown in FIG. 8, one or more siphon structures 86 may be provided on the magnetoresistive track between the curved section 82 and the first section 81 and/or the second section 83. The siphon structures 86 comprise a portion of the magnetoresistive track having a curve or S-shape. The siphon structures 86 are shaped so as to allow magnetic domain walls to cross straight across the crossing 84 but to prevent the magnetic domain walls from turning at the crossing 84 or from getting stuck (i.e., pinned) at the crossing 84. For example, the angle, curvature, and length of the siphon structure bend is designed such that the magnetic field angle at which the domain walls propagate along each sensing element prevents the magnetic domain wall from turning at the crossing 84. That is, the siphon structures 86 act to cause a delay in the movement of the magnetic domain wall as the external magnetic field rotates, such that when the magnetic domain wall arrives at the crossing 84, the dominant driving force component of the external magnetic field drives the magnetic domain wall straight across the crossing 84. By providing the siphon structure 86, the magnetoresistive track including the crossing 84 can also be formed in a single plane. It should be understood that this means that the magnetoresistive track may be flat at the crossing 84, and the first and second sections 81, 83 of the magnetoresistive track are in substantially the same plane, or that the second section 83 of the looped section 85 may be laid directly on top of the first section 81 at the crossing 84.

Figure 9:
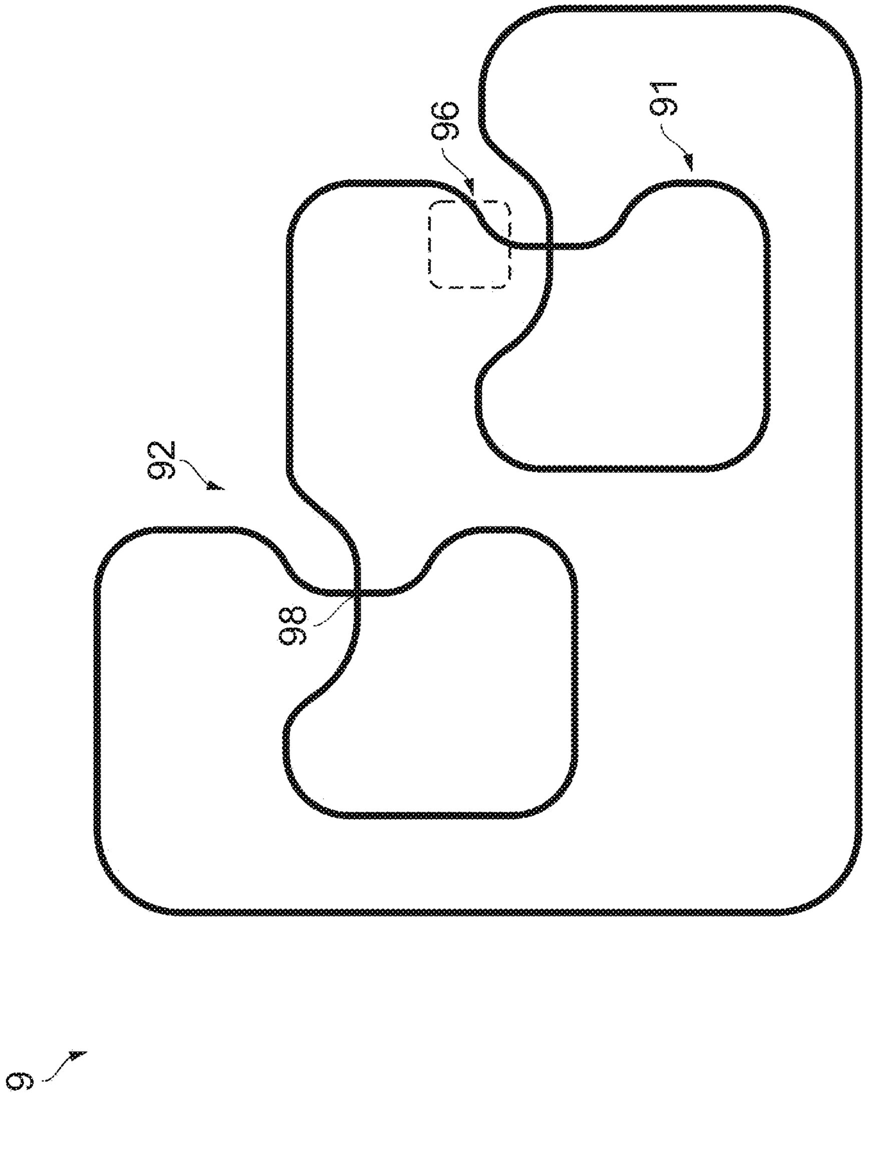
FIG. 9 illustrates a magnetoresistive track of a magnetic multi-turn sensor according to another embodiment.
Figure 10:
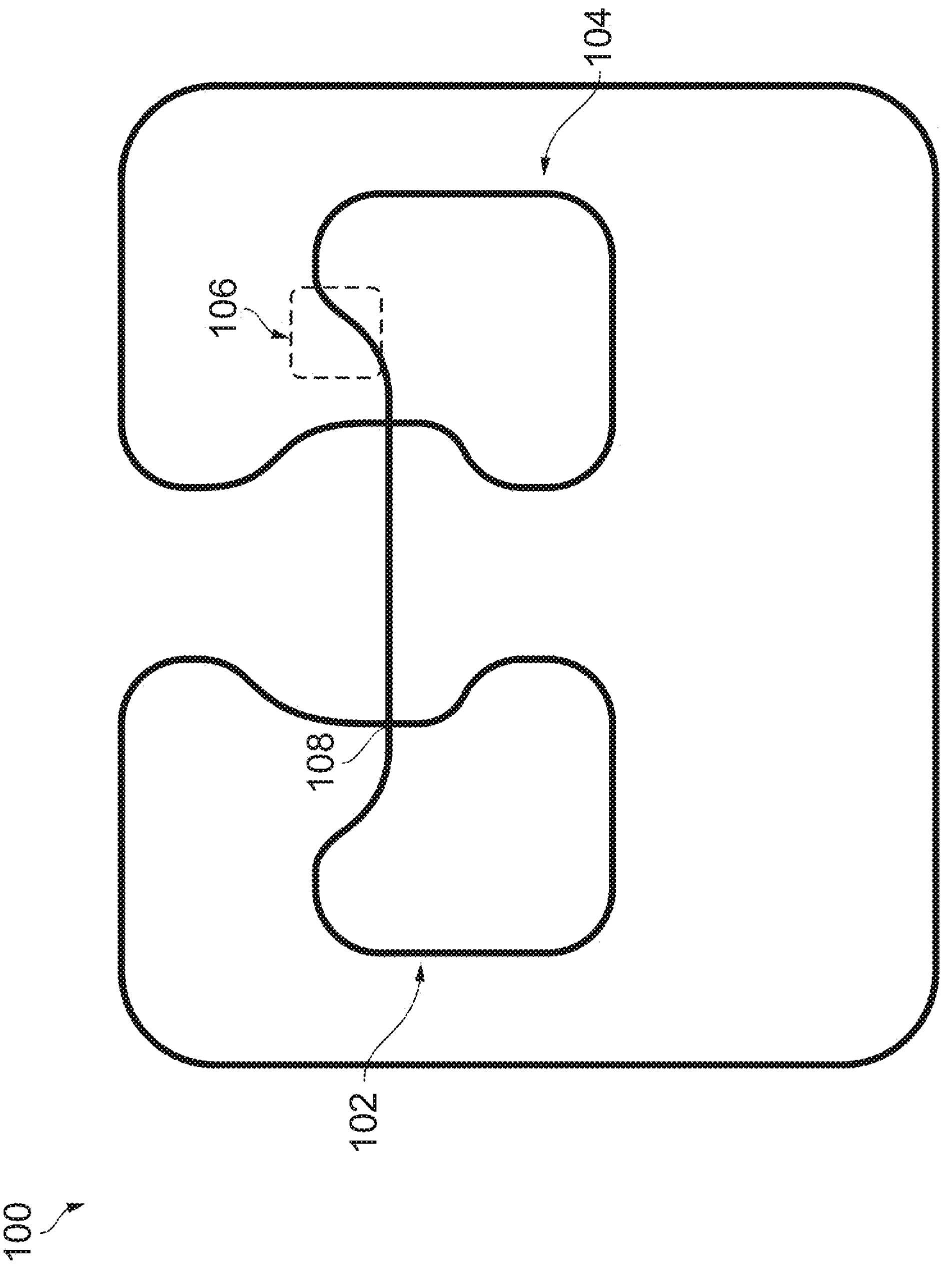
FIG. 10 illustrates a magnetoresistive track of a magnetic multi-turn sensor according to another embodiment.

The siphon structure 80 may be included in any of the magnetoresistive tracks previously discussed. FIGS. 9 and 10 illustrate magnetoresistive tracks 9, 10 comprising a plurality of looped sections 91, 92, 102, 104 each comprising a crossing 98, 108 as explained above and one or more siphon structures 96, 106 indicated as an example by the dashed boxes. It should be understood that in the arrangement shown in FIG. 10, where a first looped section 102 and a second looped section 104 are arranged with no change in the orientation of the magnetoresistive track 100 between them, then a siphon structure between the crossings 108 of the first looped section 102 and the second looped section 104 may be omitted. In this case, the magnetic domain walls may propagate through both crossings 108 at the same magnetic field angle, i.e., without needing the magnetic field to rotate.

Figure 15:
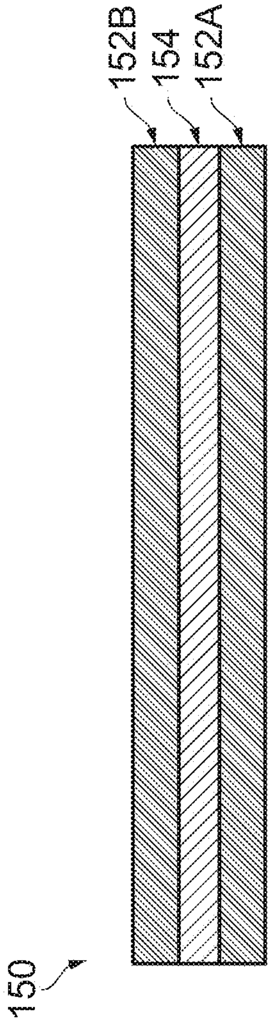
FIG. 15 illustrates a crossing of a looped portion of a magnetoresistive track according to one embodiment.

In some examples, the siphon structure 86 may be omitted. In this case, at least a portion of the looped section of the magnetoresistive track may be arranged in more than one plane, optionally with a spacer layer provided between the sections of magnetoresistive track in different planes, such that at the crossing, the second portion of the looped section passes above or below the first portion of the looped section. For example, FIG. 15 illustrates a cross-sectional view of a crossing 150 of a looped portion, in which a spacer layer 154 is provided between the first section 152A and second section 152B of magnetoresistive track. In such cases, it will be understood that the spacer layer may be formed of any suitable non-magnetic material, for example, aluminum oxide ($Al_2O_3$), silicon nitride ($Si_3N_4$), silicon oxide ($SiO_2$), tantalum, ruthenium, titanium and/or titanium tungsten. In doing so, the spacer layer does not interfere with the propagation of the domain walls. As another example, the substrate on which the magnetoresistive track is formed may be configured with a trench and bridge arrangement to allow the first and second portions of the looped sections to pass over one other. This configuration may also prevent the magnetic domain walls from being able to turn at the crossing, and ensure that they travel straight across the crossing.

Figure 11:
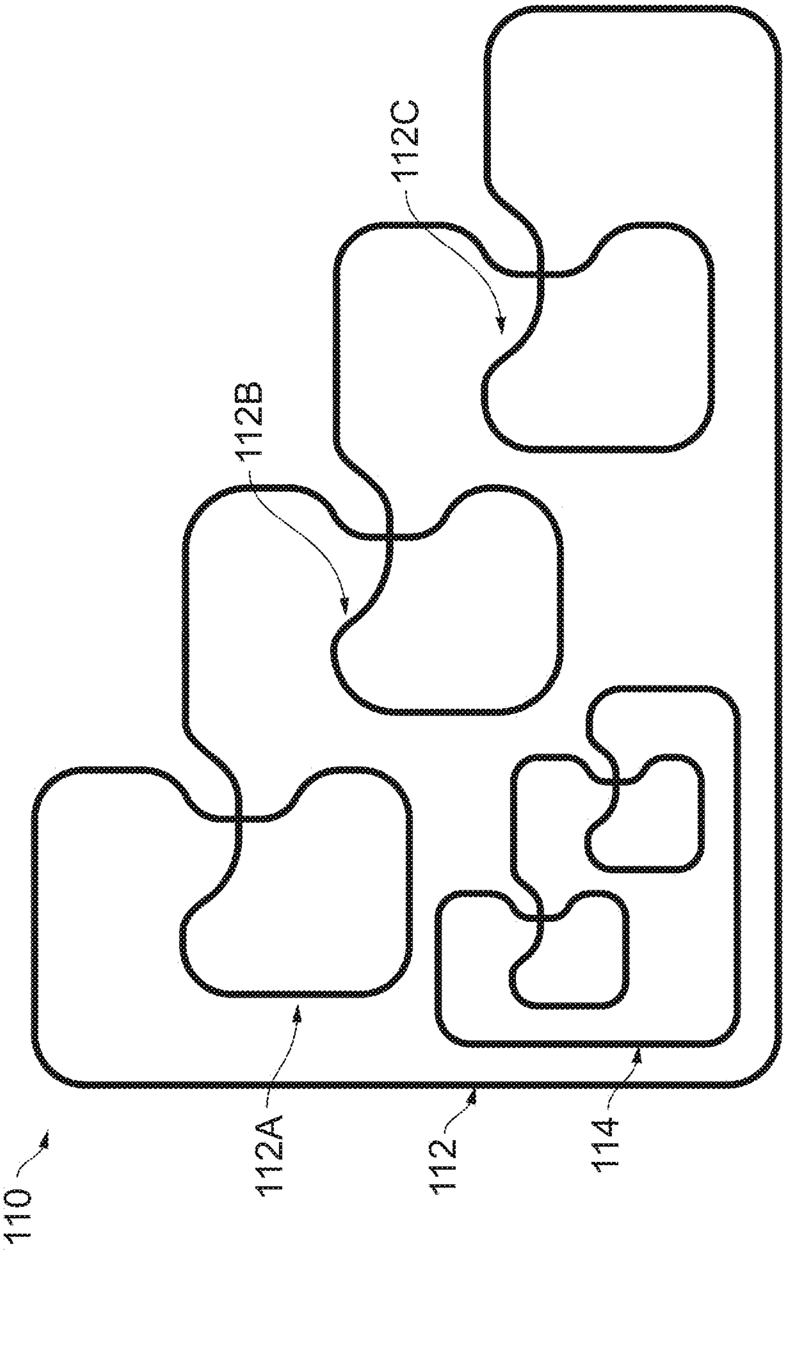
FIG. 11 illustrates a magnetic multi-turn sensor according to another embodiment.

FIG. 11 illustrates a multi-turn sensor 110 according to another embodiment. In the example of FIG. 11, there is provided a first magnetoresistive track 112 and a second magnetoresistive track 114 embedded within the closed loop of the first magnetoresistive track 112. The first and second magnetoresistive tracks 112, 114 each comprise a plurality of looped sections. The first magnetoresistive track 112 comprises three looped sections 112A, 112B, 112C. The second magnetoresistive track 114 comprises two looped sections. By arranging the second magnetoresistive track 114 within the loop of the first magnetoresistive track 112, improvements can be made on device size requirements (for example, compared to extending the number of looped sections of the first magnetoresistive track 112).

Although in FIG. 11 the first magnetoresistive track 112 is illustrated as having three looped sections 112A, 112B, 112C and the second magnetoresistive track 114 is illustrated as having two looped sections, the present disclosure is not limited thereto. The first magnetoresistive track 112 and the second magnetoresistive track 114 may each have any number of looped sections. However, further advantages are achieved when the first magnetoresistive track 112 and the second magnetoresistive track 114 have a co-prime number of turns. When the first magnetoresistive track 112 and the second magnetoresistive track 114 have a co-prime number of turns, the number of rotations relative to the external magnetic field countable by a device having the first magnetoresistive track 112 and the second magnetoresistive track 114 is equal to the product of the co-prime number of turns. In the example of FIG. 11, the magnetic multi-turn sensor 110 is arranged to count 2×3=6 rotations. As explained above, the first magnetoresistive track 112 and the second magnetoresistive track 114 may have a different number of turns, or looped sections.

Further, a magnetic multi-turn sensor may be formed of any number of magnetoresistive tracks as described herein. For example, a magnetic multi-turn sensor may be formed to have a first magnetoresistive track having 13 turns, a second magnetoresistive track inside the first magnetoresistive track having 11 turns, and a third magnetoresistive track inside the second magnetoresistive track having 7 turns. Such a magnetic multi-turn sensor would be capable of counting 13×11×7=1001 rotations.

It should be understood that arranging a plurality of magnetoresistive tracks 112, 114 to be embedded within one another as shown in FIG. 11 achieves improvements in device size requirements. However, the present disclosure is not limited thereto. In another example, a first magnetoresistive track 112 and a second magnetoresistive track 114 may be arranged adjacent to each other on a single substrate surface, or may be provided on separate substrate surfaces.

Figure 12:
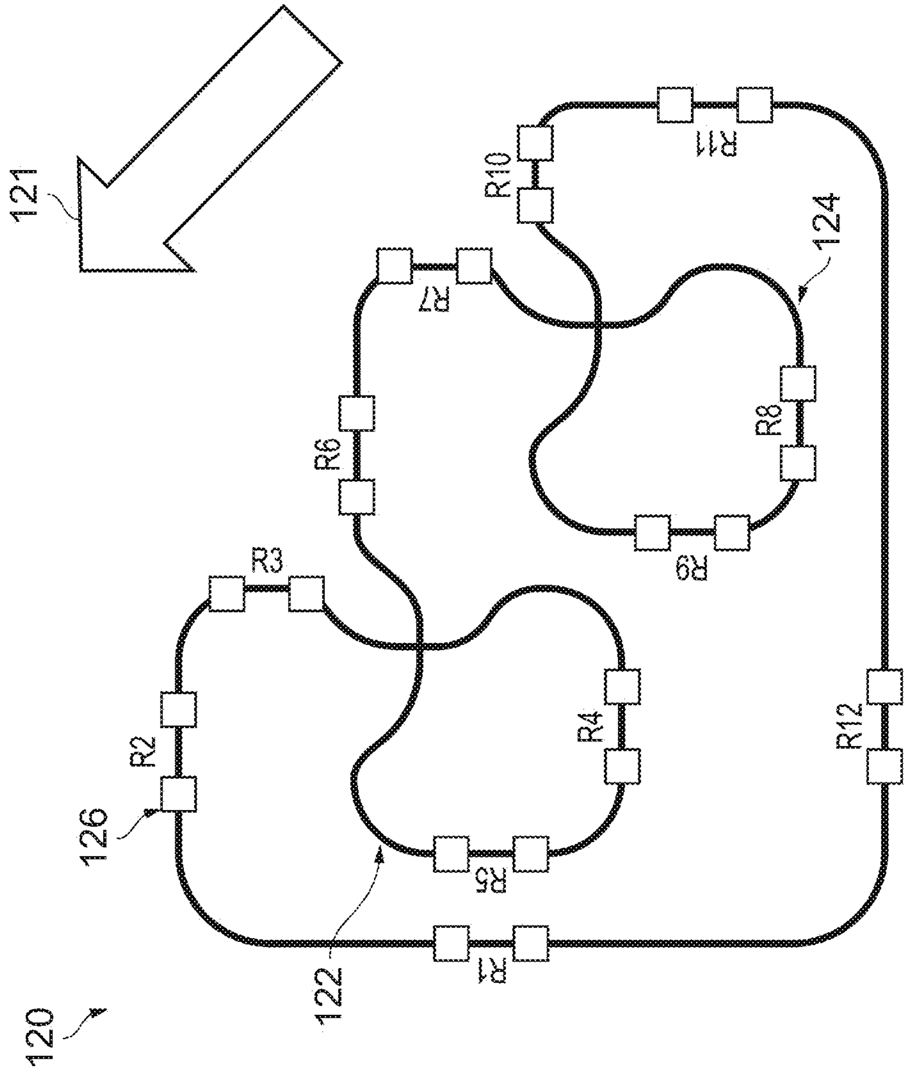
FIG. 12 illustrates a magnetoresistive track of a magnetic multi-turn sensor having a plurality of readout resistors according to one embodiment.

FIG. 12 illustrates a magnetoresistive track 120 of a magnetic multi-turn sensor according to the present disclosure. The magnetoresistive track 120 of FIG. 12 is the same as the magnetoresistive track 9 of FIG. 9, but further comprises a plurality of readout points in the form of electrical contacts 126 arranged around the magnetoresistive track 120 to thereby sensor read-out, the electrical contacts 126 defining a plurality of resistors (i.e., sensing elements) R1, R2, R3, R4, R5, R6, R7, R8, R9, R10, R11, and R12 (R1-R12) therebetween. It should be understood that electrical contacts may be included on any of the magnetoresistive tracks of the other Figures described above.

As explained above, to determine rotation of an external magnetic field, a free layer and a pinned reference layer is provided. A change in the resistance of the resistors R1-R12 is detected when there is a change in the relative orientation of the magnetisation direction of the free layer and the magnetisation direction (denoted by arrow 121) of the pinned reference layer. Resistance may be highest when the magnetisation state of the magnetoresistive track 120 and the pinned reference layer are antiparallel, and lowest when they are parallel. In the example of FIG. 12, the arrow indicates a magnetisation direction 121 of the pinned reference layer. In FIG. 12, the magnetisation direction 121 of the pinned reference layer is at a 45 degree angle to all of the resistor elements R1-R12. However, as will be discussed, the present disclosure is not limited thereto. As an external magnetic field rotates, magnetic domain walls propagate along the magnetoresistive track 120, causing the magnetisation of each resistor element R1-R12 to changes as it passes along, thus changing the relative orientation of the magnetisation state of the free layer and the pinned reference layer. This will cause a resistance change which can be detected at the readout points 126 to determine the rotation of the external magnetic field.

In FIG. 12, the plurality of electrical contacts 126 are arranged on straight sections of the magnetoresistive track 120 at a periodicity of 90 degrees. That is, each time the magnetoresistive track 120 turns through 90 degrees, the magnetoresistive track 120 comprises a straight section where at least one resistor R1-R12 is provided. In this way, the magnetic multi-turn sensor can detect state changes in response to 90 degree rotations of an external magnetic field. It should be understood that this is an example, and that a different number of resistors R1-R12 may be provided, or the resistors R1-R12 may be provided at a different periodicity. Providing a different number of resistors R1-R12 or providing the resistors R1-R12 at a different periodicity may change the sensitivity of the magnetic multi-turn sensor to rotations. For example, as shown in FIG. 12, the plurality of resistors R1-R12 comprise a first set of resistors (R2, R4, R6, R10, R12) arranged horizontally on the page, and a second set of resistors (R1, R3, R5, R7, R9, R11) arranged vertically on the page. It would be possible to detect rotation of the magnetic field if only the first set or only the second set of resistors R1-R12 were provided, but the sensitivity of the magnetic multi-turn sensor would be to turns of 180 degrees.

Figure 13:
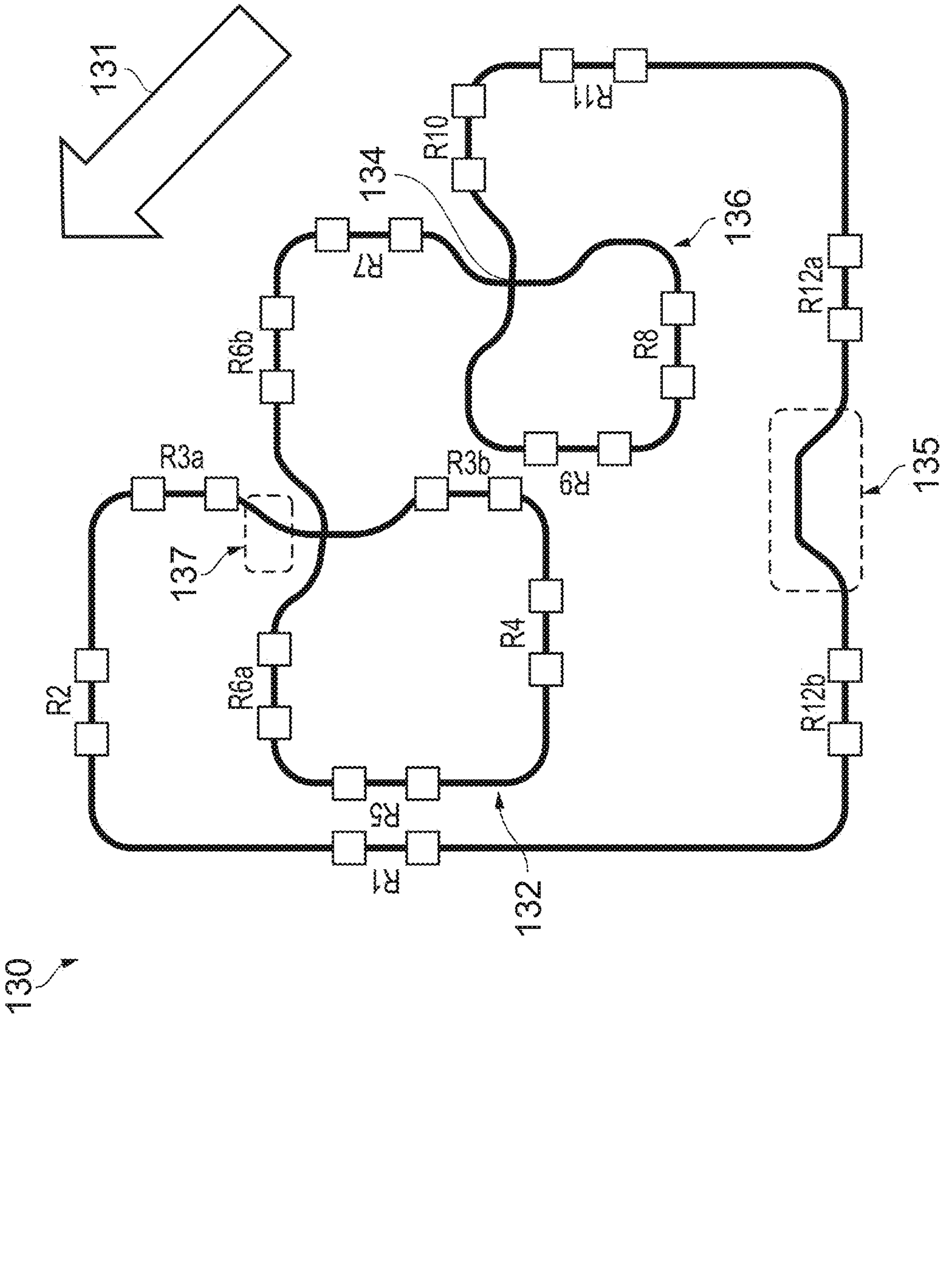
FIG. 13 illustrates a magnetoresistive track of a magnetic multi-turn sensor having a plurality of readout resistors according to another embodiment.

FIG. 13 illustrates a magnetoresistive track 130 similar to the magnetoresistive track 120 of FIG. 12. However, the magnetoresistive track 130 of FIG. 13 is further configured to detect a direction of rotation of an external magnetic field. The magnetoresistive track 130 of FIG. 13 comprises a plurality of resistors R1-R12 similar to those of FIG. 12, but comprises additional resistors (denoted by the suffixes "a", "b") separated by a siphon structure 137 or a siphon-like structure 135. That is, the magnetoresistive track 130 of FIG. 13 comprises a plurality of resistor pairs R12*a-b*, R3*a-b*, R6*a-b*, each resistor pair R12*a-b*, R3*a-b*, R6*a-b* comprising a first resistor R12*a*, R3*a*, Roa and a second resistor R12*b*, R3*b*, R6*b*. The first resistor R12*a*, R3*a*, R6*a* and the second resistor R12*b*, R3*b*, Rob are provided on a first straight section and a second straight section of the magnetoresistive track 130 respectively. The first resistor R12*a*, R3*a*, R6*a* and the second resistor R12*b*, R3*b*, R6*b* are separated by a siphon structure 137, which has been explained above, or a siphon-like structure 135. The siphon-like structure 135 comprises a curved or S-shaped section of the magnetoresistive track 130 but is not formed as part of a crossing 134 or a looped section 132, 136.

The magnetoresistive track 130 of FIG. 13 is configured, when included in a magnetic multi-turn sensor, to allow the determination of a direction of rotation. In particular, by providing paired resistors R12*a-b*, R3*a-b*, R6*a-b* comprising a first resistor R12*a*, R3*a*, R6*a* and a second resistor R12*b*, R3*b*, R6*b* separated by a siphon structure 137 or a siphon-like structure 135, a direction of rotation can be determined by determining which resistor of the resistor pair R12*a-b*, R3*a-b*, R6*a-b* detects a change of resistance first. As has been discussed above, a siphon structure 137 may slow the propagation of a magnetic domain wall around the magnetoresistive track 130. This facilitates the detecting of a magnetisation state change in the one of the resistors of the resistor pair R12*a-b*, R3*a-b*, R6*a-b* before the other resistor in the resistor pair R12*a-b*, R3*a-b*, R6*a-b*, despite both resistors being arranged on the same part of the magnetoresistive track 130. The siphon-like structure 135 may be understood to function in substantially the same way.

Figure 14:
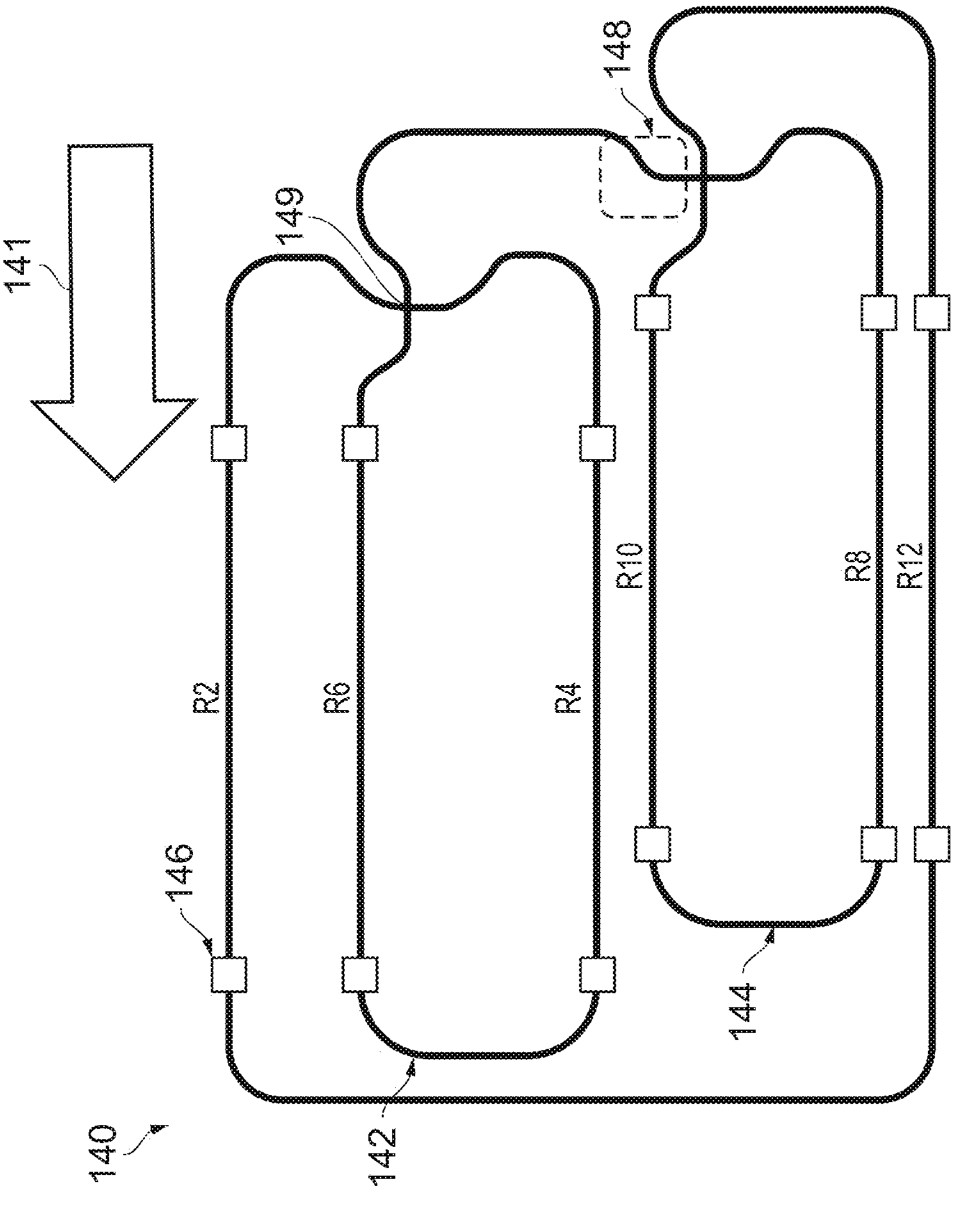
FIG. 14 illustrates a magnetoresistive track of a magnetic multi-turn sensor having a plurality of readout resistors according to another embodiment.

FIG. 14 illustrates a magnetoresistive track 140 similar to the magnetoresistive track 120 of FIG. 12. However, in the magnetoresistive track 140 of FIG. 14, the plurality of resistors R2, R4, R6, R8, R10, R12 all have the same orientation. In this case, as the resistors R2, R4, R6, R8, R10, R12 may detect a change of state of the magnetoresistive track 140 when an external magnetic field rotates by 180 degrees, the magnetoresistive track 140 can have an elongated shape in a direction of the magnetisation of the reference pinning layer. By aligning the resistors R2, R4, R6, R8, R10, R12 in the direction of the reference pinning layer 141, the resistors R2, R4, R6, R8, R10, R12 observe a greater change in resistance by a factor of sqrt (2) as the free later and the reference pinning layer move between parallel and antiparallel magnetisation states. In addition, the elongated shape of the magnetoresistive track 140 may be advantageous for device area considerations. In this example, the vertical sections of the magnetoresistive track 140 (i.e., the sections which do not have any resistors) may be made shorter, which reduces the likelihood of defects.

Aspects of the present disclosure therefore provide a magnetoresistive track comprising one or more looped sections. The looped sections comprise a crossing where the magnetoresistive track crosses itself at substantially 90 degrees. By arranging the magnetoresistive track in this way, a fabrication complexity of the magnetoresistive track can be reduced. The magnetoresistive track can be included as part of a magnetic multi-turn sensor configured to count rotations of an external magnetic field. The present disclosure provides arrangements for the magnetoresistive track which ensure that magnetic domain walls can only propagate as desired through the crossings by providing either a siphon structure or implementing the magnetoresistive track in two or more planes. Further, a magnetic multi-turn sensor can be design for counting a desired number of rotations by forming the magnetoresistive track with a particular number of looped sections. Multiple magnetoresistive tracks can be embedded within each other to reduce space requirements. The sensor read-out arrangement can be configured to achieve a desired sensitivity to rotations of the magnetic field, or to enable an elongated shape which may be advantages for device space requirements. Further, the siphon structure or a siphon-like structure can be provided between paired resistors to enable detection of a direction of rotation.

In any of the arrangements described herein, it will be appreciated that the one or more magnetoresistive tracks may be disposed on a printed circuit board (PCB) comprising processing circuitry for processing the sensor signal. It will also be appreciated that the magnetoresistive track may be a giant magnetoresistive (GMR) or tunnel magnetoresistive (TMR) film.

Figure 16:
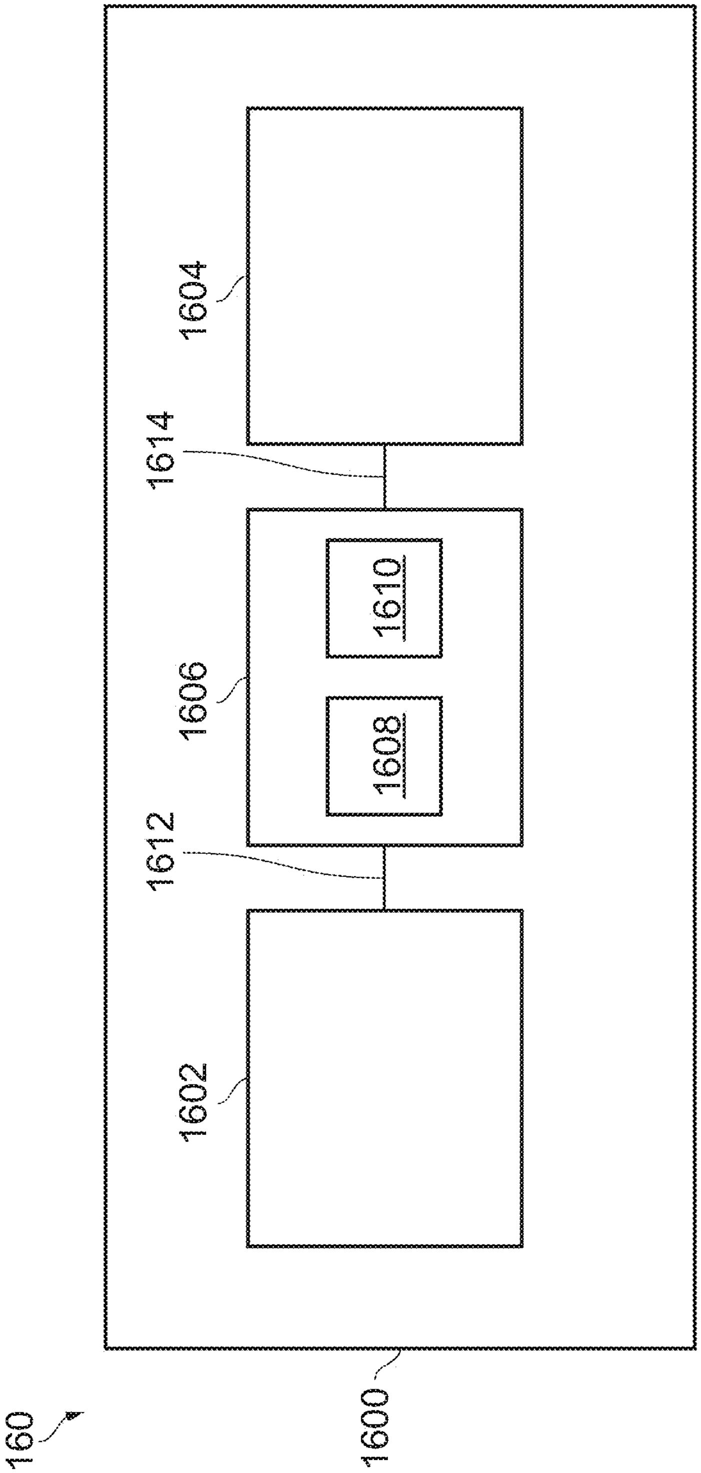
FIG. 16 illustrates an example of magnetic sensor system according to one embodiment.

FIG. 16 illustrates a schematic block diagram of an example magnetic sensor system 160 that includes an xMR multi-turn (MT) sensor 1602, which may comprise any of the magnetoresistive tracks described herein. The magnetic sensor system 160 may also include a magnetic single turn (ST) sensor 1604, which may be an anisotropic magnetoresistive (AMR), giant magnetoresistive (GMR) or tunnel magnetoresistive (TMR) based position sensor, although it will be appreciated that the magnetic sensor system 160 may be implemented without the ST sensor 1604 or with a different type of magnetic angle sensor.

The sensor system 160 also comprises a processing circuit 1606, and an integrated circuit 1600 on which the MT sensor 1602, the ST sensor 1604 and processing circuit 1606 are disposed. The processing circuit 1606 receives signals SMT 1612 from the MT sensor 1602 and processes the received signals to determine that the turn count using a turn count decoder 1608, which will output a turn count representative of the number of turns of an external magnetic field (not shown) rotating in the vicinity of the MT sensor 1602. Similarly, the processing circuit 1606 may also receive signals Ssr 1614 from the ST sensor 1604 and process the received signals using a position decoder 1610 to output an angular position of the external magnetic field.

Applications

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for correcting rotational angle position data derived from rotating magnetic fields. Additionally, the devices can include any magnetoresistance or Hall effect devices capable of sensing magnetic fields.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure.

What is claimed is:

1. A magnetic multi-turn sensor, comprising:

at least one magnetoresistive track extending in a closed loop configuration and comprising two or more looped sections, wherein each of the two or more looped sections encloses a respective area, wherein each of the two or more looped sections comprises a first section of magnetoresistive track and a second section of magnetoresistive track, wherein the first section of magnetoresistive track and the second section of magnetoresistive track are configured to overlap at a crossing, a curved section of magnetoresistive track extending between the first section of magnetoresistive track and the second section of magnetoresistive track, and wherein a first area enclosed by a first looped section of the two or more looped sections is distinct from a second area enclosed by a second looped section of the two or more looped sections.

2. The magnetic multi-turn sensor of claim 1, wherein the at least one magnetoresistive track turns through about 360 degrees in each of the two or more looped sections, such that first section of magnetoresistive track is substantially perpendicular to the second section of magnetoresistive track.

3. The magnetic multi-turn sensor of claim 1, wherein each of the two or more looped sections further comprises one or more siphon sections, the one or more siphon sections being configured to restrict movement of magnetic domain walls through the crossing.

4. The magnetic multi-turn sensor of claim 3, wherein the one or more siphon sections are arranged proximal to at least one of the first section of magnetoresistive track or the second section of magnetoresistive track.

5. The magnetic multi-turn sensor of claim 3, wherein the one or more siphon sections comprise an S-shaped bend in the at least one magnetoresistive track.

6. The magnetic multi-turn sensor of claim 3, wherein the at least one magnetoresistive track is provided in a first plane.

7. The magnetic multi-turn sensor of claim 1, wherein the first section of magnetoresistive track is arranged in a first plane and the second section of magnetoresistive track is arranged in a second plane different from the first plane.

8. The magnetic multi-turn sensor of claim 7, further comprising a spacer layer provided between the first section of magnetoresistive track and the second section of magnetoresistive track, wherein the spacer layer is at least provided in a region of the crossing.

9. The magnetic multi-turn sensor of claim 1, further comprising a plurality of looped sections arranged in-line or staggered along the at least one magnetoresistive track.

10. The magnetic multi-turn sensor of claim 1, wherein the at least one magnetoresistive track comprises a plurality of magnetoresistive tracks each comprising a different number of looped portions.

11. The magnetic multi-turn sensor of claim 10, wherein the plurality of magnetoresistive tracks comprise a first magnetoresistive track and a second magnetoresistive track, wherein the second magnetoresistive track is arranged within a closed loop of the first magnetoresistive track.

12. The magnetic multi-turn sensor of claim 11, wherein the first magnetoresistive track and the second magnetoresistive track have a co-prime number of looped sections.

13. The magnetic multi-turn sensor of claim 1, further comprising a plurality of electrical contacts arranged on the at least one magnetoresistive track to thereby define a plurality of sensing elements.

14. The magnetic multi-turn sensor of claim 13, wherein the at least one magnetoresistive track comprises a plurality of straight sections, the plurality of straight sections separated by bends on the at least one magnetoresistive track, wherein the plurality of electrical contacts are provided on at least one of the plurality of straight sections.

15. The magnetic multi-turn sensor of claim 14, wherein the plurality of sensing elements are arranged on at least a portion of the respective plurality of straight sections of the at least one magnetoresistive track at a period of about 90 degrees.

16. The magnetic multi-turn sensor of claim 13, wherein the plurality of sensing elements are arranged at an angle of between about 0 degrees and about 90 degrees with respect to a reference direction of the at least one magnetoresistive track.

17. The magnetic multi-turn sensor of claim 13, wherein one or more of the plurality of sensing elements are arranged parallel to a reference direction of the at least one magnetoresistive track, and wherein the at least one magnetoresistive track is longer in a direction parallel to the reference direction than in a direction perpendicular to the reference direction.

18. The magnetic multi-turn sensor of claim 13, wherein the plurality of sensing elements comprise at least one pair of sensing elements separated by an S-shaped section of the at least one magnetoresistive track and configured to determine a direction of rotation of an external magnetic field.

19. The magnetic multi-turn sensor of claim 1, further comprising an initialization coil configured to apply a reset magnetic field to the at least one magnetoresistive track to thereby initialize the magnetoresistive track into a known magnetisation state.

20. A magnetic multi-turn sensor, comprising:

at least two magnetoresistive tracks, each of the at least two magnetoresistive tracks extending in a closed loop configuration and comprising two or more looped sections, wherein each of the two or more looped sections comprises a first section of magnetoresistive track and a second section of magnetoresistive track, wherein the first section of magnetoresistive track and the second section of magnetoresistive track are configured to overlap at a crossing, a curved section of magnetoresistive track extending between the first section of magnetoresistive track and the second section of magnetoresistive track, wherein each of the at least two magnetoresistive tracks comprises a different number of looped sections, and wherein at least one of the at least two magnetoresistive tracks comprises a first area enclosed by a first looped section of the two or more looped sections that is distinct from a second area enclosed by a second looped section of the two or more looped sections.

* * * * *